US010002936B2

(12) United States Patent
Haukka et al.

(10) Patent No.: US 10,002,936 B2
(45) Date of Patent: Jun. 19, 2018

(54) TITANIUM ALUMINUM AND TANTALUM ALUMINUM THIN FILMS

(71) Applicant: ASM IP Holding B.V., Almere (NL)

(72) Inventors: Suvi Haukka, Helsinki (FI); Michael Givens, Phoenix, AZ (US); Eric Shero, Phoenix, AZ (US); Jerry Winkler, Gilbert, AZ (US); Petri Räisänen, Gilbert, AZ (US); Timo Asikainen, Helsinki (FI); Chiyu Zhu, Helsinki (FI); Jaakko Anttila, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 250 days.

(21) Appl. No.: 14/919,180

(22) Filed: Oct. 21, 2015

(65) Prior Publication Data

US 2016/0118261 A1 Apr. 28, 2016

Related U.S. Application Data

(60) Provisional application No. 62/067,802, filed on Oct. 23, 2014.

(51) Int. Cl.
*H01L 23/48* (2006.01)
*H01L 23/52* (2006.01)
(Continued)

(52) U.S. Cl.
CPC .......... *H01L 29/4966* (2013.01); *C23C 16/06* (2013.01); *C23C 16/34* (2013.01);
(Continued)

(58) Field of Classification Search
CPC ......... H01L 21/28556; H01L 21/28562; H01L 21/32051; H01L 29/4966; C23C 16/06;
(Continued)

(56) References Cited

U.S. PATENT DOCUMENTS 3,708,728 A 1/1973 Sterling et al.
3,925,337 A 12/1975 Heiberger
(Continued)

FOREIGN PATENT DOCUMENTS

EP 0387403 9/1990
EP 0394054 10/1990
(Continued)

OTHER PUBLICATIONS

1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous[Anon], Sep. 19, 2005.
(Continued)

*Primary Examiner* — Fernando L Toledo
*Assistant Examiner* — Aaron Gray
(74) *Attorney, Agent, or Firm* — Knobbe, Martens, Olson & Bear, LLP

(57) ABSTRACT

A process for depositing titanium aluminum or tantalum aluminum thin films comprising nitrogen on a substrate in a reaction space can include at least one deposition cycle. The deposition cycle can include alternately and sequentially contacting the substrate with a vapor phase Ti or Ta precursor and a vapor phase Al precursor. At least one of the vapor phase Ti or Ta precursor and the vapor phase Al precursor may contact the substrate in the presence of a vapor phase nitrogen precursor.

22 Claims, 7 Drawing Sheets

(51) Int. Cl.
  *H01L 29/40* (2006.01)
  *H01L 21/3205* (2006.01)
  *H01L 21/4763* (2006.01)
  *H01L 21/44* (2006.01)
  *H01L 29/49* (2006.01)
  *C23C 16/455* (2006.01)
  *H01L 21/285* (2006.01)
  *C23C 16/06* (2006.01)
  *C23C 16/34* (2006.01)
  *H01L 29/51* (2006.01)

(52) U.S. Cl.
  CPC .. *C23C 16/45523* (2013.01); *C23C 16/45525* (2013.01); *C23C 16/45531* (2013.01); *H01L 21/28562* (2013.01); *H01L 21/32051* (2013.01); *H01L 29/517* (2013.01)

(58) Field of Classification Search
  CPC .............. C23C 16/34; C23C 16/45527; C23C 16/45531; C23C 16/45525; C23C 16/45523; C23C 16/45529
  USPC ...... 257/751, E21.17, E21.19; 438/592, 680, 438/585
  See application file for complete search history.

(56) References Cited

U.S. PATENT DOCUMENTS

| | | |
|---|---|---|
| 4,058,430 A | 11/1977 | Suntola et al. |
| 4,085,430 A | 4/1978 | Gerkema et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,356,673 A | 10/1994 | Schmitt et al. |
| 5,382,333 A | 1/1995 | Ando et al. |
| 5,438,028 A | 8/1995 | Weissman et al. |
| 5,443,647 A | 8/1995 | Aucoin et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,691,365 A | 11/1997 | Crooks et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,820,965 A | 10/1998 | Pyzik et al. |
| 5,855,680 A | 1/1999 | Soininen |
| 5,915,004 A | 6/1999 | Sherman |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,006,793 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,200,893 B1 | 3/2001 | Sneh |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,279 B1 | 10/2003 | Ritala et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,838,125 B2 | 1/2005 | Chung et al. |
| 6,863,727 B1 | 3/2005 | Elers et al. |
| 6,902,763 B1 | 6/2005 | Elers et al. |
| 6,936,535 B2 | 8/2005 | Kim et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,141,278 B2 | 11/2006 | Koh et al. |
| 7,144,806 B1 | 12/2006 | Fair et al. |
| 7,144,809 B2 | 12/2006 | Elers et al. |
| 7,211,144 B2 | 5/2007 | Lu et al. |
| 7,211,507 B2 | 5/2007 | Dunn et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,485,340 B2 | 2/2009 | Elers et al. |
| 7,485,349 B2 | 2/2009 | Koh et al. |
| 7,611,751 B2 | 11/2009 | Elers |
| 7,666,474 B2 | 2/2010 | Li et al. |
| 7,749,871 B2 | 7/2010 | Elers et al. |
| 7,794,798 B2 | 9/2010 | Hautala |
| 8,268,409 B2 | 9/2012 | Elers et al. |
| 8,841,182 B1 | 9/2014 | Chen et al. |
| 8,846,550 B1 | 9/2014 | Shero et al. |

(56) References Cited

U.S. PATENT DOCUMENTS

| | | |
|---|---|---|
| 9,111,749 B2 | 8/2015 | Shero et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0032281 A1 | 2/2003 | Werkhoven et al. |
| 2003/0049931 A1 | 3/2003 | Byun et al. |
| 2003/0072975 A1 | 4/2003 | Shero et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1 | 11/2003 | Derderian et al. |
| 2003/0219942 A1 | 11/2003 | Choi et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0064247 A1 | 3/2005 | Sane et al. |
| 2005/0095443 A1 | 5/2005 | Kim et al. |
| 2005/0095763 A1 | 5/2005 | Samavedam et al. |
| 2005/0102205 A1 | 5/2005 | Yamamoto et al. |
| 2005/0215008 A1 | 9/2005 | Orlowski et al. |
| 2005/0271813 A1 | 12/2005 | Kher et al. |
| 2005/0280050 A1 | 12/2005 | Doczy et al. |
| 2006/0019494 A1 | 1/2006 | Cao et al. |
| 2006/0049931 A1 | 3/2006 | Sugimura |
| 2006/0063395 A1 | 3/2006 | Lee |
| 2006/0147626 A1 | 7/2006 | Blomberg |
| 2006/0165892 A1 | 7/2006 | Weidman |
| 2006/0211224 A1 | 9/2006 | Matsuda et al. |
| 2006/0220249 A1 | 10/2006 | Johnston et al. |
| 2006/0223300 A1 | 10/2006 | Simka et al. |
| 2006/0240187 A1 | 10/2006 | Weidman |
| 2006/0251812 A1 | 11/2006 | Kang et al. |
| 2007/0018342 A1 | 1/2007 | Sandhu et al. |
| 2007/0054046 A1 | 3/2007 | Ishizaka et al. |
| 2007/0069177 A1 | 3/2007 | Peters et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0194106 A1* | 8/2008 | Oh .................. C23C 16/34 438/685 |
| 2008/0274617 A1 | 11/2008 | Milligan |
| 2009/0081868 A1 | 3/2009 | Shah et al. |
| 2009/0275198 A1* | 11/2009 | Kamepalli ........... H01L 45/06 438/659 |
| 2009/0315093 A1 | 12/2009 | Li et al. |
| 2010/0102417 A1* | 4/2010 | Ganguli ............... C23C 16/34 257/532 |
| 2011/0263115 A1 | 10/2011 | Ganguli et al. |
| 2011/0298062 A1 | 12/2011 | Ganguli et al. |
| 2012/0322250 A1 | 12/2012 | Ganguli et al. |
| 2013/0078454 A1 | 3/2013 | Thompson et al. |
| 2014/0127405 A1 | 5/2014 | Li et al. |
| 2014/0273428 A1* | 9/2014 | Shero ............... H01L 21/02211 438/592 |
| 2015/0179440 A1 | 6/2015 | Chen et al. |
| 2015/0325447 A1* | 11/2015 | Ogawa ............ H01L 21/28088 438/680 |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| EP | 0804631 | 9/2002 |
| JP | 58-033841 | 2/1983 |
| JP | 06-037041 | 2/1994 |
| JP | 06-069157 | 3/1994 |
| JP | 07-230957 | 8/1995 |
| JP | 08-264530 | 10/1996 |
| JP | 09-087857 | 3/1997 |
| KR | 10-2001-0088044 | 12/2001 |
| KR | 10-2002-0031160 | 6/2002 |
| KR | 10-2002-0087192 | 12/2002 |
| KR | 10-2003-0005727 | 1/2003 |
| KR | 2003-0016346 | 2/2003 |
| KR | 10-2003-0014115 | 3/2003 |
| KR | 10-2003-0014117 | 3/2003 |
| KR | 10-2003-0033234 | 5/2003 |
| KR | 10-2003-0040758 | 6/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/063957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/61833 | 8/2001 |
| WO | WO 01/66832 | 9/2001 |
| WO | WO 01/78213 | 10/2001 |
| WO | WO 01/88972 | 11/2001 |
| WO | WO 03/102265 | 12/2003 |
| WO | WO 2004/077515 | 9/2004 |
| WO | WO 2006/080782 | 8/2006 |
| WO | WO 2006/093260 | 9/2006 |
| WO | WO 2007/041089 | 4/2007 |
| WO | WO 2008/137399 | 11/2008 |

OTHER PUBLICATIONS

Aarik et al., "Influence of substrate temperature on atomic layer growth and properties of HfO2 thin films", Thin Solid Films, vol. 340, 1999, pp. 110-116.

Aggarwal et al., "Predictors of Mortality and Resource Utilization in Cirrhotic Patients Admitted to the Medical ICU*", Chest, May 2001, vol. 5, Issue 119, pp. 1489-1497.

Alen et al., "Atomic Layer Deposition of Ta(AL)N(C) Thin Films Using Trimethylaluminum as a Reducing Agent", Journal of the

(56) References Cited

OTHER PUBLICATIONS

Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chatterjee, Sub-100nm Gate Length Metal Gate NMOS Transistors Fabricated by a Replacement Gate Process, IEDM '97, pp. 821-824 (1997).
Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).
Elers et al., NbC15 as a precursor in atomic layer epitaxy, Applied Surface Science, Jul. 9, 1994, vol. 82/83, pp. 468-474.
European Search Report dated May 5, 2008, Application No. 08 000 724.8.
Favis et al., Atomic layer epitaxy of silicon, silicon/germanium and silicon carbide via extraction/exchange processes, Avail. NTIS. Report, 1991, pp. 33.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.
Harrison et al., Poly-gate REplacement Through Contact Hole (PRETCH): A new method for High-K/Metal gate and multi-oxide implementation on chip, IEDM Technical Digest, Electron Devices Meeting, IEEE International (2004).
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of $ZnS_{1-x}Se_x$ thin films by substituting surface sulfur with elemental selenium," Appl. Surface Sci., 112:154-158 (1997).
International Preliminary Examination Report dated May 7, 2009 and International Search Report dated Jan. 31, 2008 for Application No. PCT/US2007/081960.
International Search Report and Written Opinion dated Apr. 7, 2008, Application No. PCT/US2007/082131.
International Search Report and Written Opinion dated Jan. 31, 2008, Application No. PCT/US2007/081960.
International Search Report dated Sep. 17, 2008 for Application No. PCT/US2008/061845.
International Search Report and Written Opinion dated Apr. 15, 2010, Application No. PCT/US2009/040705.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Jones et al., Growth of aluminum films by low pressure chemical vapour deposition using tritertiarybutylaluminium, Journal of Crystal Growth, vol. 135, Issue 1, pp. 285-289 (1994).
Jones et al., Recent developments in metalorganic precursors for metalorganic chemical vapour deposition, Journal of Crystal Growth, vol. 146, Issues 1-4, pp. 503-510 (1995).

Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., Atomic-layer-depositied WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," ieee International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS $46^{th}$ International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Kukli et al., Properties of $(Nb_{1-x}Ta_x)_2O_5$ Solid Solutions and $(Nb_{1-x}Ta_x)_2O_5$—$ZrO_2$ Nanolaminates Growth by Atomic Layer Epitaxy, , NanoStructured Materials, 1997, vol. 8, pp. 785-793.
Kukli et al., "Properties of Atomic Layer Deposited $(Ta_{1-x}Nb_x)_2O_5$ Solid Solution Films and $Ta_2O_5$—$Nb_2O_5$ Nanolaminates", J. Appl. Phys., Nov. 1999, vol. 86, Issue 10, pp. 5656-5662.
Lai et al., Precursors for Organometallic Chemical Vapor Deposition of Tungsten Carbide Films, Chem. Mater., 1995, vol. 7, pp. 2284-2292.
Lakomaa et al., "Surface reactions in $Al_2O_3$ growth from trimethylaluminum and water by atomic layer epitaxy," Applied Surface Science, vol. 107, pp. 107-115 (1996).
Leskelä et al., ALD precursor chemistry: Evolution and future challenges, Jour. Phys. IV France 9, 1999, pp. 837-852.
Ludviksson et al., Low-Temperature Thermal CVD of Ti—Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J. Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., Cu(ThD)2 as Copper Source in Atomic Layer Epitaxy, Electrochemical Society Proceedings, vol. 97-25, (1997) pp. 1529-1536.
Mason et al., Hydrolysis of Tri-tert-butylaluminum: The First Structural Characterization of Alkylalumoxanes [$(R_2Al)_2O$], and $(RalO)_n$, J. Am. Chem. Soc., vol. 115, No. 12, 1993, pp. 4971-4984.
Massachusetts Institute of Technology, Solid State Research, Quarterly Technical Report, Aug. 10, 1995.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and $HN_3$, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

(56) References Cited

OTHER PUBLICATIONS

Park et al., "Plasma-Enchanced Atomica Layer Deposition of Ta—N Thin Films", Journal of the Electrochemical Society, Electrochemical Society, Jan. 2002, vol. 149, Issue 1, pp. C28-C32, Manchester, New Hampsire.
Park et al., Substituted Aluminum Metal Gate on High-K Dielectric for Low Work-Function and Fermi-Level Pinning Free, Electron Devices Meeting, IEDM Technical Digest, IEEE International (2004).
Polyakov et al., Growth of GaBN Ternary Soloutions by Organometallic Vapor Phase Epitaxy, Journal of Electronic Materials, 1997, vol. 26, Issue 3, pp. 237-242.
Riihela et al., "Introducing Atomic Layer Epitaxy for the Deposition of Optical Thin Flms", Thin Solid Films, 1996, vol. 289, pp. 250-255.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from $TiI_4$ and $NH_3$, J. Electrochem. Soc., Aug. 1998, vol. 145, Issue 8, pp. 2914-2920.
Ritala et al., "Controlled Growth of TaN, $Ta_3N_5$, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and $Al_2O_3$ films deposited by atomic layer deposition, Chem. Vapor Deposition, 1999, vol. 5, pp. 7-9.
Ritala et al., Surface roughness reduction in atomic layer epitaxy grown of titanium dioxide thin films, Thin Solid Films, vol. 249, pp. 155-162 (1994).
Ryu et al., "Bariers for Copper Interconnections", Solid State Technology, Apr. 1999, vol. 53.
Sadayuki et al., Sub-atomic layer growth of SiC at low temperatures, Japanese Journal of Applied Physics, 1995, vol. 34, Issue 11, pp. 6166-6170.
Salim, In-situ Fourier Transform Infrared Spectroscopy of Chemistry and Growth in Chemical Vapor Deposition, Massachusetts Institute of Technology, Jun. 1995.
Salim et al., In situ concetration monitoring in a vertical OMVPE reactor by fiber-optics-based Fourier transform infrared spectroscopy, Journal of Crystal Growth, vol. 169, Issue 3, pp. 443-449.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Sherman et al., Plasma enhanced atomic layer deposition of Ta for diffusion barrier applications, AVS $46^{th}$ International Symposium, Oct. 26, 1999, Seattle, WA, US.
Tulhoff et al., Ullmann's Encyclopedia of Industrial Chemistry, $5^{th}$, Completely Revised Edition, 1986, vol. A5, pp. 61-77.
Suntola, "Atomic Layer Epitaxy," Handbook of Crystal Growth 3, Ch. 14, pp. 601-663 (1994).
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wang et al., Tritertiarybutylaluminum as an organometallic source for epitaxial growth of AlGaSb, Appl. Phys. Lett. 67 (10), Sep. 4, 1995, pp. 1384-1386.
Wong et al., Barriers for copper interconnections, Solid State Technology, 1999, pp. 1-4.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Yu et al., Modulation of the Ni FUSI workfunction by Yb doping: from midgap to n-type band-edge, Electron Devices Meeting, IEDM Technical Digest, IEEE International (2005).
Zhang et al., "High permittivity thin film nanolaminates," Journal of Applied Physics, vol. 87, No. 4, pp. 1921-1924 (2000).
Office Action dated Dec. 11, 2003 in Taiwanese Application No. 098112674 with English Translation.

* cited by examiner

TITANIUM ALUMINUM AND TANTALUM ALUMINUM THIN FILMS

CROSS-REFERENCE TO RELATED APPLICATIONS

This application claims the benefit of U.S. Provisional Application No. 62/067,802, filed Oct. 23, 2014, entitled "TITANIUM ALUMINUM FILMS" the disclosure of which is incorporate herein by reference in its entirety.

BACKGROUND OF THE INVENTION

Field of the Invention

The present invention relates generally to vapor deposition processes, and more particularly, to deposition of titanium aluminum or tantalum aluminum thin films.

Description of the Related Art

Titanium aluminum or tantalum aluminum containing thin films may be used in a variety of contexts, particularly in the semiconductor industry, for example to be used in integrated circuits. Such films may be of interest for use in, for example, metal gate applications or in other applications, like barrier and electrode applications, for example, in integrated circuits. Deposition of such films with suitable structural and electrical characteristics for incorporation in semiconductor devices has heretofore proven difficult.

SUMMARY OF THE INVENTION

Processes for depositing titanium aluminum or tantalum aluminum thin films comprising nitrogen on a substrate in a reaction space may comprise at least one deposition cycle. Each cycle may comprise alternately and sequentially contacting the substrate with a vapor phase Ti or Ta precursor and a vapor phase Al precursor. In each cycle at least one of the vapor phase Ti or Ta precursor and the vapor phase Al precursor may contact the substrate in the presence of a vapor phase nitrogen precursor.

In some embodiments the Al precursor may comprise an alky or alkenyl compound or a derivative thereof. In some embodiments the Al precursor may comprise an alane, aminealane, or aluminum hydride compound or a derivative thereof. In some embodiments the Al precursor comprises tritertbutylaluminum (TTBA). In some embodiments the Ti or Ta precursor comprises a halide ligand. In some embodiments the titanium or tantalum precursor comprises $TiCl_4$. In some embodiments the titanium or tantalum precursor comprises $TaCl_5$. In some embodiments the aluminum precursor comprises tritertbutylaluminum (TTBA) and the titanium or tantalum precursor comprises $TiCl_4$. In some embodiments the aluminum precursor comprises tritertbutylaluminum (TTBA) and the titanium or tantalum precursor comprises $TaCl_5$.

In some embodiments the vapor phase nitrogen precursor is introduced into the reaction space concurrently with one or both of the Ti or Ta precursor and the Al precursor. In some embodiments the vapor phase nitrogen precursor serves as a carrier gas for one or both of the Ti or Ta precursor and the Al precursor. In some embodiments the vapor phase nitrogen precursor comprises $N_2$.

In some embodiments at least one deposition cycle is carried out at less than 500° C. In some embodiments at least one deposition cycle is carried out at about 300° C. to about 400° C. In some embodiments excess precursor and reaction byproducts, if any, are removed from the reaction space after contacting the substrate with the vapor phase Ti or Ta precursor and before subsequently contacting the substrate with the vapor phase Al precursor. In some embodiments the vapor phase nitrogen precursor flows into the reaction space throughout the deposition cycle and aids in the removal of excess precursor and reaction byproducts, if any, from the reaction space.

In some embodiments the titanium aluminum or tantalum aluminum thin film comprises up to about 40% carbon on an atomic basis. In some embodiments the titanium aluminum or tantalum aluminum thin film comprises up to about 25% nitrogen on an atomic basis. In some embodiments the process is an atomic layer deposition process. In some embodiments at least one of the reactants at least partially decomposes on the substrate surface.

According to some embodiments a process for depositing a titanium aluminum thin film comprising nitrogen on a substrate in a reaction space comprises one or more deposition cycles. Each deposition cycle may comprise contacting the substrate with a first vapor phase precursor comprising $TiCl_4$, removing excess first vapor phase precursor and reaction byproducts, if any, from the substrate, contacting the substrate with a second vapor phase precursor comprising TTBA, and removing excess second vapor phase precursor and reaction byproducts, if any, from the substrate. In some embodiments at least one of the contacting the substrate with a first vapor phase precursor comprising $TiCl_4$ and contacting the substrate with a second vapor phase precursor comprising TTBA steps occurs in the presence of a nitrogen precursor comprising $N_2$. In some embodiments the one or more deposition cycles are carried out at about 300° C. to about 400° C.

According to some embodiments a process for depositing a tantalum aluminum thin film comprising nitrogen on a substrate in a reaction space comprises one or more deposition cycles. Each deposition cycle may comprise contacting the substrate with a first vapor phase precursor comprising $TaCl_5$, removing excess first vapor phase precursor and reaction byproducts, if any, from the substrate, contacting the substrate with a second vapor phase precursor comprising TTBA, and removing excess second vapor phase precursor and reaction byproducts, if any, from the substrate. In some embodiments at least one of the contacting the substrate with a first vapor phase precursor comprising $TaCl_5$ and contacting the substrate with a second vapor phase precursor comprising TTBA steps occurs in the presence of a nitrogen precursor. In some embodiments the one or more deposition cycles are carried out at about 300° C. to about 400° C.

In some embodiments the titanium aluminum or tantalum aluminum thin film comprising nitrogen comprises up to about 25% nitrogen on an atomic basis. In some embodiments the titanium aluminum or tantalum aluminum thin film comprising nitrogen comprises up to about 40% carbon on an atomic basis. In some embodiments the nitrogen precursor comprising $N_2$ is introduced into the reaction space as a carrier gas for each of the first vapor phase precursor comprising $TiCl_4$ and the second vapor phase precursor comprising TTBA.

In some embodiments removing excess second vapor phase precursor comprising TTBA comprises continuing to flow the nitrogen precursor comprising $N_2$ into the reaction space without providing second vapor phase precursor comprising TTBA. In some embodiments removing excess first vapor phase precursor comprising $TiCl_4$ comprises continuing to flow the nitrogen precursor comprising $N_2$ without providing first vapor phase precursor comprising $TiCl_4$. In some embodiments a deposition cycle is repeated two or more times to deposit a TiAl film comprising nitrogen to a desired thickness. In some embodiments both first vapor phase precursor comprising $TiCl_4$ and the second vapor phase precursor comprising TTBA contact the substrate in the presence of a nitrogen precursor comprising $N_2$ in each deposition cycle.

In some embodiments removing excess second vapor phase precursor comprising TTBA comprises continuing to flow the nitrogen precursor into the reaction space without providing second vapor phase precursor comprising TTBA. In some embodiments removing excess first vapor phase precursor comprising $TaCl_5$ comprises continuing to flow the nitrogen precursor without providing first vapor phase precursor comprising $TaCl_5$. In some embodiments a deposition cycle is repeated two or more times to deposit a TaAl film comprising nitrogen to a desired thickness. In some embodiments both first vapor phase precursor comprising $TaCl_5$ and the second vapor phase precursor comprising TTBA contact the substrate in the presence of a nitrogen precursor in each deposition cycle.

According to some embodiments a process for depositing a titanium aluminum thin film comprising nitrogen on a substrate in a reaction space comprises at least one deposition cycle. In some embodiments the deposition cycle may comprise contacting the substrate with a first vapor phase precursor comprising $TiCl_4$, removing excess first vapor phase precursor and reaction byproducts, if any, from the substrate, contacting the substrate with a second vapor phase precursor comprising TTBA, and removing excess second vapor phase precursor and reaction byproducts, if any, from the substrate. In some embodiments at least one of the contacting the substrate with a first vapor phase precursor comprising $TiCl_4$ and contacting the substrate with a second vapor phase precursor comprising TTBA steps occurs in the presence of a nitrogen precursor comprising $N_2$. In some embodiments the process further comprises optionally contacting the substrate with a protective treatment reagent comprising a silane or borane. In some embodiments the process further comprises optionally repeating at least the first vapor phase precursor and second vapor phase precursor contacting and removing steps until TiAl thin film comprising nitrogen of the desired thickness has been formed.

According to some embodiments a process for depositing a tantalum aluminum thin film comprising nitrogen on a substrate in a reaction space comprises at least one deposition cycle. In some embodiments the deposition cycle may comprise contacting the substrate with a first vapor phase precursor comprising $TaCl_5$, removing excess first vapor phase precursor and reaction byproducts, if any, from the substrate, contacting the substrate with a second vapor phase precursor comprising TTBA, and removing excess second vapor phase precursor and reaction byproducts, if any, from the substrate. In some embodiments at least one of the contacting the substrate with a first vapor phase precursor comprising $TaCl_5$ and contacting the substrate with a second vapor phase precursor comprising TTBA steps occurs in the presence of a nitrogen precursor. In some embodiments the process further comprises optionally contacting the substrate with a protective treatment reagent comprising a silane or borane. In some embodiments the process further comprises optionally repeating at least the first vapor phase precursor and second vapor phase precursor contacting and removing steps until TaAl thin film comprising nitrogen of the desired thickness has been formed.

In some embodiments the substrate is contacted with a protective treatment reagent comprising a silane or borane in each deposition cycle. In some embodiments the silane or borane is selected from the group consisting of monosilane, disilane, trisilane, borane, diborane, and triborane. In some embodiments the substrate is contacted with a protective treatment reagent comprising a silane or borane after every 2, 5, 10, 20 or more deposition cycles. In some embodiments the TiAl or TaAl thin film comprising nitrogen comprises from about 5 at % to about 50 at % silane or borane. In some embodiments the protective treatment reagent comprises a vapor phase protective treatment reagent.

DETAILED DESCRIPTION

Figure 1:
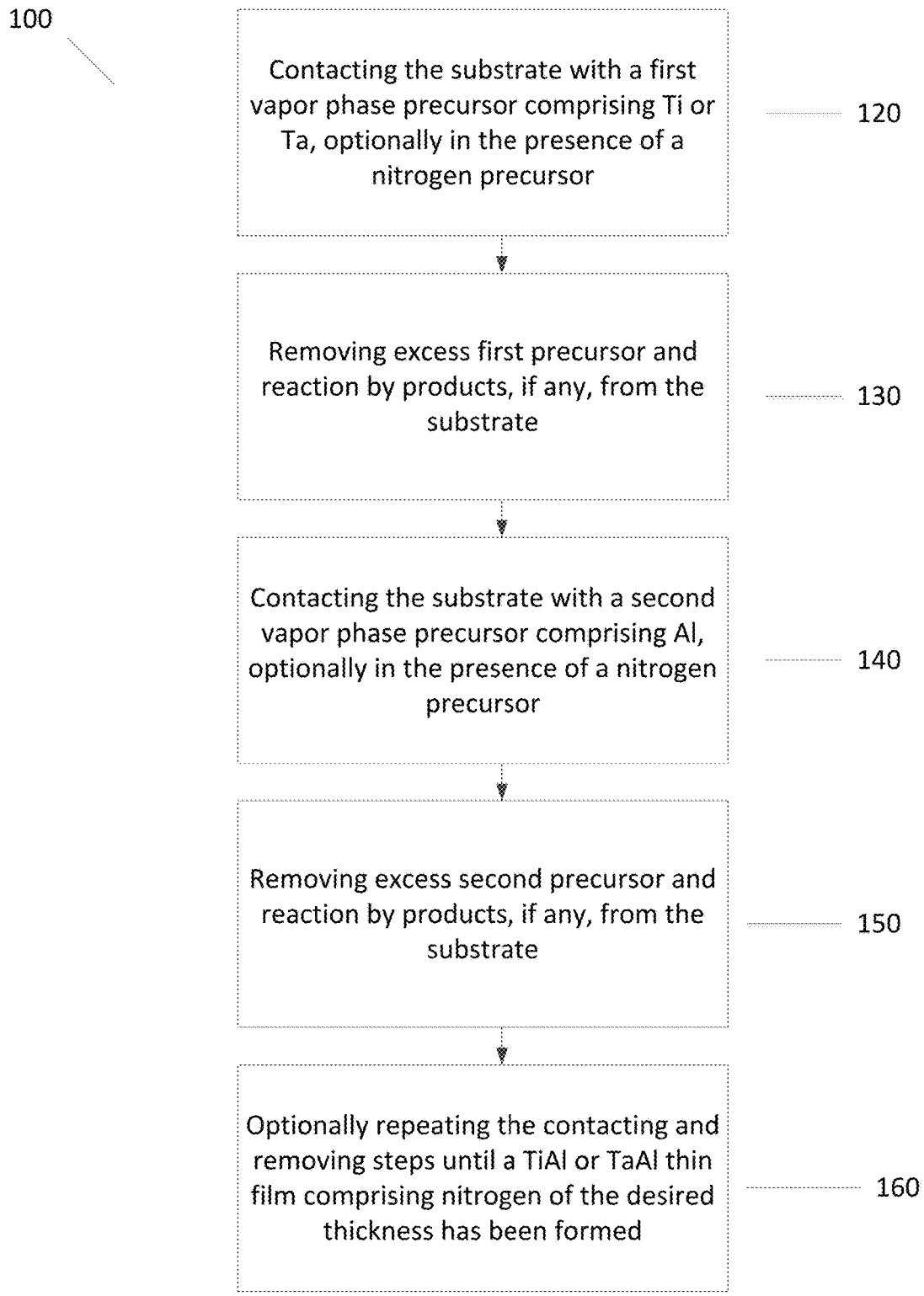
FIG. 1 illustrates a flow diagram for a deposition process for depositing a TiAl or TaAl thin film comprising nitrogen on a substrate in a reaction space.

Titanium aluminum or tantalum aluminum films can be deposited from aluminum reactants that do not comprise beta hydrogens, such as tirtertbutylaluminum (TTBA) and a titanium or tantalum precursor, such as $TiCl_4$ in a cyclical deposition process. As described herein, it has been surprisingly found that if the films are deposited in the presence of nitrogen, such as a molecular nitrogen carrier gas, nitrogen is incorporated into the film, even at relatively low temperatures. In some embodiments, the addition of nitrogen to the film improves one or more film properties. For example, the TiAl or TaAl films comprising nitrogen deposited according to the present disclosure may have lower work functions than TiAl or TaAl films without nitrogen and at the same time may have lower resistivities. In some embodiments the resistivity of a TiAl or TaAl film deposited according to the present disclosure is lower than the resistivity of a similar metal carbide films, such as TiC.

As used herein, TiAl or TaAl is used for simplicity and is not intended to limit, restrict, or define the bonding or chemical state, for example the oxidation state, of any Ti, Ta, Al, and/or any other elements in the film. Further, a TiAl or TaAl film, layer, or material as referred to herein may comprise elements in addition to Ti, Ta, and/or Al. For example a TiAl or TaAl film may also comprise nitrogen.

In some embodiments the resistivity of a TiAl or TaAl film deposited is from about 3 to about $10^5$ μΩcm as measured from about 10 nm thick films. In some embodiments the resistivity of a TiAl or TaAl film deposited is from about 50 to about $10^4$ μΩcm as measured from about 10 nm thick films. In some embodiments the resistivity of a TiAl or TaAl film deposited is less than about $5\times10^3$ μΩcm, less than about 1000 μΩcm, less than about 400 μΩcm as measured from about 10 nm thick films. In some embodiments the resistivity of a TiAl or TaAl film deposited is less than about 200 μΩcm as measured from about 10 nm thick films. Resistivity of the film generally varies if the films are thin, in which case the resistivity is usually higher, and in case of thicker films the resistivity might be closer bulk or bulk thin film resistivity values.

Titanium aluminum (TiAl) or tantalum aluminum (TaAl) thin films comprising nitrogen can be used in a variety of contexts, including metal gate and gate electrode applications in metal oxide semiconductor field effect transistors (MOSFETs), such as n-channel MOSFETs (NMOS).

According to some embodiments, processes for depositing a TiAl or TaAl thin film comprising nitrogen on a substrate in a reaction space can include alternately and sequentially contacting the substrate with a vapor phase aluminum (Al) precursor and a vapor phase titanium (Ti) or tantalum (Ta) precursor in the presence of a vapor phase nitrogen precursor.

In some embodiments TiAl or TaAl films comprising nitrogen are deposited by a process comprising one or more deposition cycles, where at least one deposition cycle comprises alternately and sequentially contacting a substrate in a reaction space with a vapor phase Al precursor in the presence of a vapor phase nitrogen precursor, and a Ti or Ta precursor in the presence of a vapor phase nitrogen precursor. The deposition cycle may be repeated two or more times in order to deposit a TiAl or TaAl film comprising nitrogen to a desired thickness. In some embodiments the deposition process is an ALD type process.

In some embodiments nitrogen may be incorporated from a nitrogen precursor, for example $N_2$, into a deposited TiAl or TaAl thin film. In some embodiments nitrogen may be incorporated into a deposited TiAl or TaAl thin film from, for example, a carrier gas comprising a nitrogen precursor, for example an $N_2$ carrier gas. In some embodiments where nitrogen is incorporated from a nitrogen precursor into the deposited TiAl or TaAl thin films, certain properties of the films, for example eWF, may be different than in TiAl or TaAl films deposited by a process that does not include a nitrogen precursor. For example, in some embodiments where nitrogen is incorporated from a carrier gas comprising a nitrogen precursor into a deposited TiAl or TaAl thin film the eWF of the film may be lower than in a TiAl or TaAl film deposited using a carrier gas that does not comprise nitrogen, for example an Ar or other inert carrier gas. For example, a TiAl or TaAl film comprising nitrogen incorporated from a carrier gas comprising a nitrogen precursor may have an eWF more than about 5 mV lower, more than about 50 mV lower, or more than about 100 mV lower than in a TiAl or TaAl film deposited by a process using a carrier gas that comprises Ar or another inert carrier gas and that does not comprise a nitrogen precursor.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses. In some embodiments one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is preferably at or below about 500° C., preferably between about 250° C. and about 500° C., more preferably between about 275° C. and about 450° C., more preferably between about 300° C. and about 425° C., and most preferably between about 300° C. and about 400° C.

The surface of the substrate is contacted with a vapor phase first reactant. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

In some embodiments purging may be accomplished by shutting off the flow of precursor while continuing to flow a carrier gas. Thus, in some embodiments, the deposition cycle may comprise alternately and sequentially providing the Al precursor and Ti or Ta precursor into a continually flowing carrier gas. In some embodiments the carrier gas comprises nitrogen, such as molecular nitrogen.

The surface of the substrate is contacted with a vapor phase second gaseous reactant. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments a batch reactor may be used. Suitable batch reactors include, but are not limited to, reactors commercially available from and ASM Europe B.V (Almere, Netherlands) under the trade names ALDA400™ and A412™. In some embodiments a vertical batch reactor is utilized in which the boat rotates during processing, such as the A412™. Thus, in some embodiments the wafers rotate during processing. In some embodiments in which a batch reactor is used, wafer-to-wafer uniformity is less than 3% (1 sigma), less than 2%, less than 1% or even less than 0.5%.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

Preferably, for forming a TiAl or TaAl thin film comprising nitrogen, each ALD cycle comprises at least two distinct phase. Contacting the substrate with a first precursor and thereafter removing excess first precursor and reaction byproducts from the substrate surface may be considered a phase and may be referred to as a first phase, first precursor phase, Ti or Ta phase, Ti or Ta precursor phase, first Ti or Ta phase, and/or first Ti or Ta precursor phase. For a deposition cycle, in a first phase, the substrate is contacted with a first precursor comprising Ti or Ta, which forms no more than about one monolayer on the substrate surface. In a second phase, the substrate is contacted with a second precursor comprising Al and may convert adsorbed first reactant species to a titanium aluminum material. Contacting the substrate with a second precursor and thereafter removing excess second precursor and reaction byproducts from the substrate surface may be considered a phase and may be referred to as a second phase, second precursor phase, Al phase, Al precursor phase, first Al phase, and/or first Al precursor phase. One or more of the precursors may be provided with the aid of a carrier gas, such as $N_2$, Ar, or He. Additional phases may be added and phases may be removed as desired to adjust the composition of the final film.

As mentioned above, in some embodiments a nitrogen precursor is present in the reaction space during both the time that the substrate is contacted with the Al precursor and the time that the substrate is contacted with the Ti or Ta precursor. In some embodiments the nitrogen precursor is present in the reaction space when the substrate is contacted with the Al precursor but not when the substrate is contacted with the Ti or Ta precursor. In some embodiments the nitrogen precursor is present in the reaction space when the substrate is contacted with the Ti or Ta precursor but not when the substrate is contacted with the Al precursor.

In some embodiments the nitrogen precursor is flowed continuously to the reaction space during the entire deposition cycle, while in some embodiments the nitrogen precursor may be present in the reaction space during the time that the Al precursor and/or the Ti or Ta precursor are present. Thus, in some embodiments the nitrogen precursor may be provided at the same time as one or both of the Al and/or Ti or Ta precursors. For example, in some embodiments a carrier gas comprising the nitrogen precursor may also be used to provide the Al and/or Ti or Ta precursors. In some embodiments the nitrogen precursor, for example $N_2$, may be provided into the reaction space at a different time than one or both of the Al and/or Ti or Ta precursors. In some embodiments the nitrogen precursor, for example $N_2$, may be provided into the reaction space at separate time than one or both of the Al and/or Ti or Ta precursors.

In some embodiments, vapor phase nitrogen precursor flows into the reaction space throughout the deposition cycle and can aid in the removal of excess Al and/or Ti or Ta precursor and reaction byproducts, if any, from the reaction space. In some embodiments, excess Al precursor can be removed from the reaction space by continuing to flow vapor phase nitrogen precursor into the reaction space without providing Al precursor. Additionally, excess Ti or Ta precursor can be removed from the reaction space by continuing to flow vapor phase nitrogen precursor into the reaction space without providing Ti or Ta precursor.

In some embodiments, the vapor phase nitrogen precursor is used as a carrier gas for one of or both of the Al and Ti or Ta precursors. In other embodiments, the vapor phase nitrogen precursor can be introduced into the reaction space through a gas flow separate from the one of or both of the vapor phase Al and Ti or Ta precursors. Additionally, in some embodiments, the vapor phase nitrogen precursor may be present in the reaction space while one of or both of the Al or Ti or Ta precursors are contacting the substrate Referring to FIG. 1 and according to some embodiments a TiAl or TaAl thin film comprising nitrogen is deposited on a substrate in a reaction space by an ALD type deposition process 100 comprising at least one cycle comprising:

contacting the substrate with a first vapor phase precursor comprising Ti or Ta at step 120;

removing excess first precursor and reaction by products, if any, from the substrate at step 130;

contacting the substrate with a second vapor phase precursor comprising Al at step 140;

removing from the substrate, at step 150, excess second precursor and any gaseous by-products;

wherein at least one of the contacting the substrate with a first vapor phase precursor comprising Ti or Ta and contacting the substrate with a second vapor phase precursor comprising Al steps occurs in the presence of a nitrogen precursor; and optionally repeating at step 160 the contacting and removing steps until TiAl or TaAl thin film comprising nitrogen of the desired thickness has been formed.

In some embodiments both of the contacting the substrate with a first vapor phase precursor comprising Ti or Ta and contacting the substrate with a second vapor phase precursor comprising Al steps occur in the presence of a nitrogen precursor.

Referring again to FIG. 1, the substrate is contacted with a first precursor comprising Ti or Ta at step 120. In some embodiments the first precursor is conducted into a reaction chamber in the form of vapor phase pulse and contacted with the surface of the substrate. Conditions are preferably selected such that no more than about one monolayer of the precursor is adsorbed on the substrate surface in a self-limiting manner. However, in some embodiments conditions may be selected such that more than one monolayer of the precursor may be formed.

According to some embodiments a TiAl or TaAl thin film is deposited on a substrate in a reaction space by an ALD type deposition process comprising at least one cycle comprising:

Exposing the substrate to a first vapor phase precursor comprising Ti or Ta;

Exposing the substrate to a purge gas and/or removing excess first precursor and reaction by products, if any, from the substrate;

Exposing the substrate to a second vapor phase precursor comprising Al;

Exposing the substrate to a purge gas and/or removing excess second precursor and reaction by products, if any, from the substrate; and optionally repeating at the exposing and/or removing steps until TiAl or TaAl thin film of the desired thickness has been formed.

In some embodiments one or both of the exposing the substrate to a first vapor phase precursor comprising Ti or Ta and exposing the substrate to a second vapor phase precursor comprising Al steps occurs in the presence of a nitrogen precursor. In some embodiments the step of exposing the substrate to a first vapor phase precursor comprising Ti or Ta comprises exposing the substrate to a mixture of Ti and/or Ta precursors. In some embodiments the step of exposing the substrate to a second vapor phase precursor comprising Al comprises exposing the substrate to a mixture of Al precursors.

In some embodiments the nitrogen precursor may comprise the purge gas.

In some embodiments the step of exposing the substrate to a first vapor phase precursor comprising Ti or Ta and the step of exposing the substrate to a purge gas and/or removing excess second precursor and reaction by products, if any, from the substrate; is repeated more than one time, more than two times, more than 3, 5 or 10 times before exposing the substrate to a second vapor phase precursor comprising Al. In some embodiments when the step of exposing the substrate to a first vapor phase precursor comprising Ti or Ta is repeated more than one time the Ti or Ta precursor maybe independently selected to be same or different in the repeated exposing steps.

In some embodiments the step of exposing the substrate to a second vapor phase precursor comprising Al and the step of exposing the substrate to a purge gas and/or removing excess second precursor and reaction by products, if any, from the substrate; is repeated more than one time, more than two times, more than 3, 5 or 10 times before exposing the substrate to a first vapor phase precursor comprising Ti or Ta. In some embodiments when the step of exposing the substrate to a first vapor phase precursor comprising Al is repeated more than one time the Al precursor maybe independently selected to be same or different in the repeated exposing steps.

The first precursor pulse is preferably supplied in gaseous form. The first precursor gas is considered "volatile" for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface.

In some embodiments the first precursor optionally contacts the substrate in the presence of a nitrogen precursor. In some embodiments the first precursor is conducted into a reaction chamber with the aid of a carrier gas that comprises a nitrogen precursor, for example molecular nitrogen. In some embodiments a vapor phase nitrogen precursor can be introduced into the reaction space through a separate gas flow from the first precursor.

At step 130 excess first precursor and reaction byproducts, if any, are removed from the substrate surface, for example by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate purging times can be readily determined by the skilled artisan based on the particular circumstances.

In some embodiments purging may be accomplished by shutting off the flow of precursor while continuing to flow a carrier gas. Thus, In some embodiments removing excess first precursor and reaction byproducts, if any, may comprise stopping the flow of first precursor while continuing to flow a carrier gas, for example a gas comprising a nitrogen precursor. In some embodiments the carrier gas comprises a nitrogen precursor, such as molecular nitrogen.

In other embodiments however, removing excess first precursor and reaction byproducts, if any, may comprise moving the substrate so that the first precursor no longer contacts the substrate. In some embodiments no precursor may be removed from the various parts of a chamber. In some embodiments the substrate is moved from a part of the chamber containing a first precursor to another part of the chamber containing a second precursor or no precursor at all. In some embodiments the substrate is moved from a first reaction chamber to a second, different reaction chamber.

At step 140 the substrate is contacted with a second vapor phase precursor comprising Al. In some embodiments the second precursor is pulsed into the chamber where it reacts with the first precursor bound to the first surface of the substrate. The reaction typically forms up to about a monolayer of TiAl or TaAl material comprising nitrogen on the substrate. In some embodiments, however, more than one molecular layer of TiAl or TaAl material comprising nitrogen is formed on the substrate.

In some embodiments the second precursor optionally contacts the substrate in the presence of a nitrogen precursor. In some embodiments the second precursor is conducted into a reaction chamber with the aid of a carrier gas that comprises a nitrogen precursor, for example molecular nitrogen. In some embodiments a vapor phase nitrogen precursor can be introduced into the reaction space through a separate gas flow from the second precursor While one skilled in the art will recognize that any number of suitable second precursors may be used, appropriate second precursors include Al containing compounds that favorably react with the ligands of a previously or subsequently deposited first precursor. Accordingly, selection of an appropriate second precursor may depend on the specific first precursor used and the nature of the ligands in the first precursor. Typically, a second precursor is utilized that comprises a single vapor phase Al precursor. However, in some embodiments, a second precursor may comprise two or more Al precursors. In some embodiments a second precursor may comprise one primary aluminum precursor and one or more additional aluminum precursors, for example as contaminants or minor components thereof In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, contacting times can be on the order of minutes. The optimum contacting time can be readily determined by the skilled artisan based on the particular circumstances.

The concentration of the second precursor in the reaction chamber may be from about 0.01% by volume to about 99.0% or up to 100% by volume. And the second precursor may flow through the reaction chamber at a rate of between about 1 standard $cm^3$/min and about 4000 standard $cm^3$/min.

At step 150, excess second precursor and gaseous byproducts of the surface reaction, if any, are removed from the substrate, as described above for step 130. In some embodiments excess precursor and reaction byproducts are preferably removed with the aid of an inert gas.

The steps of contacting and removing may be optionally repeated at step 160 TiAl or TaAl thin film comprising nitrogen of a desired thickness has been formed on the first surface of the substrate, with each cycle leaving no more than about a molecular monolayer. In some cases, it might be desirable to achieve at least partial decomposition of at least one the various precursors. Thus, in some embodiments conditions may be selected such that more than one molecular layer of a TiAl or TaAl material comprising nitrogen is formed on the substrate in each deposition cycle.

The ALD processes of the present disclosure may comprise one or more cycles. Some embodiments involve the repetition of at least about 5 cycles, at least about 10 cycles, or at least about 50 cycles. In some embodiments, no more than 100 cycles are performed to form a thin film of a desirable thickness.

Although the illustrated deposition cycle for forming a TiAl or TaAl thin film comprising nitrogen begins with contacting the surface of the substrate with the first vapor phase precursor comprising Ti or Ta, in other embodiments the deposition cycle begins with contacting the surface of the substrate with the second vapor phase precursor comprising Al. It will be understood by the skilled artisan that contacting the substrate surface with the first vapor phase precursor comprising Ti or Ta and second vapor phase precursor comprising Al are interchangeable in the deposition cycle.

In some embodiments the substrate is moved such that different reactants alternately and sequentially contact the surface of the substrate in a desired sequence for a desired time. In some embodiments the removing steps, 130 and 150 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

The skilled artisan can determine the optimal reactant evaporation temperatures based on the properties of the selected precursors. The skilled artisan can determine the optimal reactant contact times through routine experimentation based on the properties of the selected precursors and the desired properties of the deposited TiAl or TaAl thin film, for example a TiAl or TaAl thin film comprising nitrogen.

The growth rate of the TiAl or TaAl thin films, for example TiAl or TaAl thin films comprising nitrogen, will vary depending on the reaction conditions. In some embodiments the growth rate may be from about 0.01 Å/cycle to about 10.0 Å/cycle, preferably from about 0.1 Å/cycle to about 5 Å/cycle, more preferably 0.3 Å/cycle to about 3.0 Å/cycle. In some embodiments the growth rate may is about 2.5 Å/cycle. In some embodiments the growth rate may be more than about 2 Å/cycle, more than about 3 Å/cycle, more than about 5 Å/cycle or more than about 10 Å/cycle, for example, in cases where some decomposition of the precursor may occur the deposition rate may increase without substantial limit when the pulse time is increased.

In some embodiments of the invention, the deposition process is carried out at a temperature of less than about 600° C., temperature of less than about 550° C., temperature of less than about 500° C. In other embodiments, the deposition process is carried out at a temperature of between about 250° C. to about 500° C., between about 300° C. to about 450° C., between about 350° C. to about 450° C. or between about 375° C. to about 425° C.

In some embodiments, the deposited TiAl or TaAl thin film, for example TiAl or TaAl thin films comprising nitrogen, may contain up to about 30% to about 40% carbon on an atomic basis (at-%). In some embodiments the TiAl or TaAl thin film may comprise carbon from about 2% to about 60%, from about 5% to about 55%, from about 10% to about 50%, from about 20% to about 45%, from about 35% to about 45% on atomic basis. In some embodiments the TiAl or TaAl thin film may comprise carbon up to about 60% or up to about 50% on atomic basis. In some embodiments the TiAl or TaAl thin film may comprise carbon from at least about 2% to at least about 20% on atomic basis. In some embodiments the TiAl or TaAl thin film may comprise up to about 20% to about 25% nitrogen on an atomic basis, with the nitrogen being incorporated from the vapor phase nitrogen precursor. In some embodiments the TiAl or TaAl thin film may comprise up to from about 0.1% to about 30%, from about 2 to about 25% nitrogen on an atomic basis, with the nitrogen being incorporated from the vapor phase nitrogen precursor. In some embodiments the TiAl or TaAl thin film may comprise more than about 1%, more than about 5%, more than about 10%, more than about 15% on atomic basis, with the nitrogen being incorporated from the vapor phase nitrogen precursor.

In some embodiments, the deposited TiAl thin film comprises Ti from about 1% to about 55%, from about 20% to about 55%, from about 30% to about 50%, from about 25% to about 35%, from about 27% to about 33% on atomic basis. In some embodiments, the deposited TiAl thin film comprises Ti at least about 10%, at least about 25%, at least about 30% on atomic basis.

In some embodiments, the deposited TiAl thin film comprises Al from about 5% to about 75%, from about 7.5% to about 60, from about 10% to about 45%, from about 10% to about 40%, from about 10% to about 20% on atomic basis.

In some embodiments, the deposited TiAl thin film comprises Al at least about 10%, at least about 25% or at least about 35% on atomic basis.

In some embodiments, the deposited TaAl thin film comprises Ta from about 1% to about 55%, from about 20% to about 55%, from about 30% to about 50%, from about 25% to about 35%, from about 27% to about 33% on atomic basis. In some embodiments, the deposited TaAl thin film comprises Ta at least about 10%, at least about 25%, at least about 30% on atomic basis.

In some embodiments, the deposited TaAl thin film comprises Al from about 5% to about 75%, from about 7.5% to about 60, from about 10% to about 45%, from about 10% to about 40%, from about 10% to about 20% on atomic basis. In some embodiments, the deposited TaAl thin film comprises Al at least about 10%, at least about 25% or at least about 35% on atomic basis.

In some embodiments, the vapor phase first precursor comprising Ti or Ta comprises $TiCl_4$, the vapor phase second precursor comprising Al comprises tritertbutylaluminum (TTBA), and the vapor phase nitrogen precursor comprises $N_2$.

Thus according to some embodiments a TiAl thin film comprising nitrogen is deposited on a substrate in a reaction space by an ALD type deposition process comprising at least one cycle comprising:

contacting the substrate with a first vapor phase precursor comprising $TiCl_4$;

removing excess first precursor and reaction by products, if any, from the substrate;

contacting the substrate with a second vapor phase precursor comprising TTBA;

removing from the substrate excess second precursor and any gaseous by-products;

wherein at least one of the contacting the substrate with a first vapor phase and contacting the substrate with a second vapor phase precursor steps occurs in the presence of a nitrogen precursor comprising $N_2$; and optionally repeating the contacting and removing steps until TiAl thin film comprising nitrogen of the desired thickness has been formed.

Thus according to some embodiments a TaAl thin film comprising nitrogen is deposited on a substrate in a reaction space by an ALD type deposition process comprising at least one cycle comprising:

contacting the substrate with a first vapor phase precursor comprising $TaCl_5$;

removing excess first precursor and reaction by products, if any, from the substrate;

contacting the substrate with a second vapor phase precursor comprising TTBA;

removing from the substrate excess second precursor and any gaseous by-products;

wherein at least one of the contacting the substrate with a first vapor phase precursor and contacting the substrate with a second vapor phase precursor steps occurs in the presence of a nitrogen precursor; and optionally repeating the contacting and removing steps until TiAl thin film comprising nitrogen of the desired thickness has been formed.

In some embodiments a TiAl thin film comprising nitrogen is deposited on a substrate in a reaction space by a cyclical deposition process comprising at least one deposition cycle comprising alternately and sequentially contacting the substrate with TTBA and $TiCl_4$, wherein at least one of TTBA and/or $TiCl_4$ contacts the substrate in the presence of $N_2$.

In some embodiments a TaAl thin film comprising nitrogen is deposited on a substrate in a reaction space by a cyclical deposition process comprising at least one deposition cycle comprising alternately and sequentially contacting the substrate with TTBA and $TaCl_5$, wherein at least one of TTBA and/or $TiCl_4$ contacts the substrate in the presence of a nitrogen precursor.

Ti Precursors

In some embodiments a precursor is utilized that comprises a single vapor phase Ti precursor. However, in some embodiments, a Ti precursor may comprise two or more Ti precursors. In some embodiments a Ti precursor may comprise one primary Ti precursor and one or more additional Ti precursors, for example as contaminants or minor components thereof. In some embodiments a Ti precursor comprises $TiCl_4$. In some embodiments the Ti precursor in a Ti precursor consists essentially of $TiCl_4$.

In some embodiments a Ti precursor comprises at least one halide ligand. In some embodiments the Ti precursor has at least one Cl-ligand. In some embodiments a vapor phase Ti precursor may be $TiCl_4$.

In some embodiments a Ti precursor comprising both Ta and Ti precursors may be used.

Ta Precursors

In some embodiments a precursor is utilized that comprises a single vapor phase Ta precursor. However, in some embodiments, a Ta precursor may comprise two or more Ta precursors. In some embodiments a Ta precursor may comprise one primary Ta precursor and one or more additional Ta precursors, for example as contaminants or minor components thereof. In some embodiments a Ta precursor comprises $TaCl_5$. In some embodiments the Ta precursor in a Ti precursor consists essentially of $TaCl_5$.

In some embodiments a Ta precursor comprises at least one halide ligand. In some embodiments the Ta precursor has at least one Cl-ligand. In some embodiments a vapor phase Ta precursor may be $TaCl_5$.

In some embodiments a Ta precursor comprising both Ta and Ti precursors may be used.

Al Precursors

In some embodiments a precursor is utilized that comprises a single vapor phase Al precursor. However, in some embodiments, an Al precursor may comprise two or more Al precursors. In some embodiments an Al precursor may comprise one primary Al precursor and one or more additional Al precursors, for example as contaminants or minor components thereof. In some embodiments the vapor phase Al precursor may comprise at least one C4-ligand, such as a C4-alkyl ligand like tertbutyl. In some embodiments the vapor phase Al precursor may be tritertbutylaluminum (TTBA). In some embodiments the aluminum precursor consists essentially of TTBA. In some embodiments the aluminum precursor has a purity of more than about 99%, more than about 99.9%, more than about 99.99%, more than about 99.999% or close to about 100%.

In some embodiments the vapor phase Al precursor may comprise an alane, aminealane or aluminum hydride compound or a derivative thereof. In some embodiments the vapor phase Al precursor does not comprise an Al—H bond. In some embodiments the vapor phase Al precursor does not comprise an isobutyl-ligand. In some embodiments the vapor phase Al precursor does not comprise tri-isobutylaluminum (TIBA).

In some embodiments the vapor phase Al precursor may comprise an alkyl or alkenyl compound, such as an aluminum allyl compound, an alkylaminealane or alkyl aluminum hydride compound or a derivative thereof In some embodiments the vapor phase Al precursor may comprise an alkyl or alkenyl aluminum compound with one or more C3-C7 ligands, preferably C4-C5 ligands, such as butyl or pentyl ligands or derivatives thereof, like 2-methylbutyl ligands.

In some embodiments the vapor phase Al precursor may be selected from: trimethylaluminum (TMA), triethylaluminum (TEA), dimethylaluminum hydride (DMAH), dimethylethylaminealane (DMEAA), trimethylaminealane (TEAA), N-methylpyrroridine-alane (MPA), tri-isobutylaluminum (TIBA).

In some embodiments a vapor phase Al precursor may comprise one or more of the following Al precursors: tritertbutylaluminum (TTBA), trimethylaluminum (TMA), triethylaluminum (TEA), dimethylaluminum hydride (DMAH), dimethylethylaminealane (DMEAA), trimethylaminealane (TEAA), N-methylpyrroridine-alane (MPA), tri-isobutylaluminum (TIBA).

Nitrogen Precursors

In some embodiments a vapor phase nitrogen precursor, or reactant, is utilized that comprises a single vapor phase nitrogen precursor. However, in some embodiments a nitrogen reactant may comprise two or more nitrogen precursors. In some embodiments a nitrogen reactant may comprise one primary nitrogen precursor and one or more additional nitrogen precursors, for example as contaminants or minor components thereof. In some embodiments the vapor phase nitrogen reactant comprises molecular nitrogen. In some embodiments the nitrogen precursor in a vapor phase nitrogen reactant consists essentially of molecular nitrogen. In some embodiments the nitrogen precursor does not comprise $NH_3$ or another nitrogen precursor having an N—H bond. In some embodiments the nitrogen precursor does not comprise hydrogen. In some embodiments the nitrogen precursor does not comprise plasma, radicals or atomic species (single atoms). In some embodiments the nitrogen precursor does not comprise nitrogen plasma, nitrogen radicals or atomic nitrogen (single N atoms). In some embodiments the nitrogen precursor comprises nitrogen atoms which are bonded together. In some embodiments the nitrogen precursor comprises nitrogen atoms which are bonded together with triple bond.

In some embodiments the vapor phase nitrogen precursor may be molecular nitrogen. In some embodiments the vapor phase nitrogen precursor may be selected from $N_2$, $NH_3$, hydrazine, and hydrazine derivatives thereof In some embodiments of the invention, the vapor phase Al precursor comprises tritertbutylaluminum (TTBA), the vapor phase Ti or Ta precursor comprises $TiCl_4$, and the vapor phase nitrogen precursor comprises $N_2$. Thus, in some embodiments a deposition cycle comprises alternately and sequentially contacting the substrate with TTBA and $TiCl_4$ in the presence of $N_2$. In some embodiments $N_2$ reacts with other species, such as, but not limited to, Ti— or Al-species, on the substrate at reaction temperatures lower than 700° C., lower than 600° C., lower than 500° C., or lower than 450° C. In some embodiments the $N_2$ may react with other species and may leave nitrogen in the deposited film. In some embodiments a vapor phase nitrogen precursor comprises $N_2$ and has a purity of more than 99.999%, more than 99.9999%, more than 99.99999% or more than 99.999999%. In some embodiments vapor phase nitrogen precursor comprises $N_2$ and is also used as carrier gas and has a purity of more than 99.999%, more than 99.9999%, more than 99.99999% or more than 99.999999%.

EXAMPLE 1

TiAl thin films comprising nitrogen were deposited by a plurality of deposition cycles. Each cycle comprised contacting a substrate in a reaction space with TTBA by introducing vapor phase TTBA into the reaction space with a $N_2$ carrier gas, purging the reaction space of excess TTBA and reaction by products, if any, by stopping the flow of TTBA and continuing the flow of $N_2$ into the reaction space, contacting the substrate with $TiCl_4$ by introducing vapor phase $TiCl_4$ into the reaction space with a $N_2$ carrier gas, and purging the reaction space of excess $TiCl_4$ and reaction byproducts, if any, by stopping the flow of $TiCl_4$ and continuing the flow of $N_2$ into the reaction space.

Figure 2:
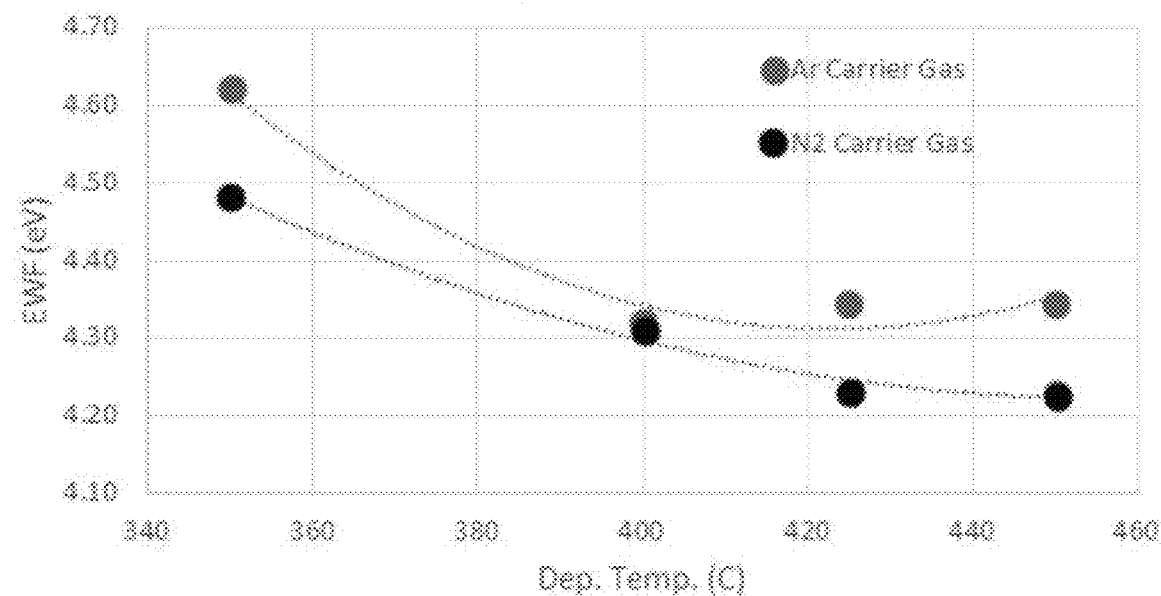
FIG. 2 shows a graph of effective work function (eWF) as a function of deposition temperature for exemplary TiAl thin films comprising nitrogen, as deposited using $N_2$ as a carrier gas, compared with exemplary TiAl films deposited using Ar as a carrier gas.

The TiAl films comprising nitrogen were deposited at a temperature of between 350° C. and 450° C. The effective work function (eWF) of the TiAl films comprising nitrogen ranged from about 4.50 eV to about 4.20 eV, depending on the TTBA dose as shown in FIG. 2. TiAl thin films were also deposited by a deposition process similar to the one described in the above paragraph, with air replacing $N_2$ in the deposition cycle. Again, the TiAl films were deposited at a temperature of between 350° C. and 450° C. The eWF of the TiAl films ranged from about 4.60 eV to about 4.35 eV as shown in FIG. 2, depending on the TTBA dose. The results achieved show that use of $N_2$ as a carrier gas resulted in a lower eWF for a film, as compared to using Ar as a carrier gas across a range of temperatures less than 500° C.

The results achieved show that TiAl films comprising nitrogen have properties that are desirable for use in NMOS transistors.

Semiconductor Device Applications

Figure 3:
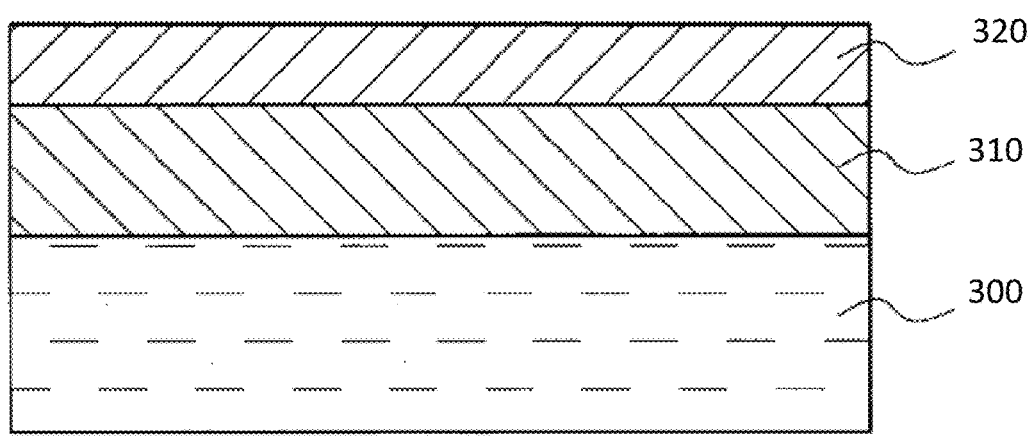
FIG. 3 is a schematic cross-sectional side view of an electrode structure, comprising a TiAl or TaAl thin film comprising nitrogen, according to some embodiments of the invention.

The TiAl or TaAl thin films formed by the processes disclosed herein can be utilized in a variety of contexts, such as in the formation of electrode structures. In some embodiments The TiAl or TaAl thin films used in semiconductor device applications comprise nitrogen. FIG. 3 illustrates an exemplary structure. Although described in terms of several specific contexts, one of skill in the art will recognize that the processes described herein are applicable to many other contexts as well.

The deposition processes disclosed herein may be successfully applied to fabricate NMOS transistors including planar devices as well as multiple gate transistors, such as FinFETs.

In some embodiments an electrode is formed by deposition of a TiAl or TaAl layer. With reference to FIG. 3, a layer of high-k dielectric material 300 is deposited onto a substrate (not shown). The substrate may be treated prior to deposition of the high-k material. For example, in some embodiments, a thin interfacial layer (not shown) may be deposited prior to deposition of the high-k material. In one embodiment a thin chemical oxide or oxynitride is formed on the surface. In other embodiments a thermal oxide is grown on the substrate.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, $Sc_2O_3$, lanthanide oxides and mixtures thereof, silicates and materials such as YSZ (yttria-stabilized zirconia), barium strontium titanate (BST), strontium titanate (ST), strontium bismuth tantalate (SBT) and bismuth tantalate (BT). Preferably, the high-k material is also deposited by an ALD process.

A layer or thin film 310 of a material such as TiN may be deposited over the dielectric layer. Such a layer may act as an etch stop layer in which the etching has been previously performed in another reactor or in another facility altogether. The transfer from one reactor or facility to another can expose the thin films to contaminants such as water or air. The water or air generally oxidizes any exposed layer such as TiN, transforming the layer into essentially TiON. Such contamination can interfere with the workfunction of the eventual stack.

A layer or thin film of TiAl or TaAl 320 is deposited over the layer 310 by a deposition process as described herein, for example an ALD type process, to form the illustrated structure. It will be appreciated that in the illustrated embodiment the layers are not necessarily drawn to scale. The TiAl or TaAl layer, thin layer of TiN, and underlying high-k material are patterned to form an electrode.

The TiAl or TaAl thin film 320 is preferably deposited over the thin film 310 by a deposition process as described herein above. In some embodiments the TiAl or TaAl thin film is deposited by an ALD type process as described herein above. In some embodiments a TiAl or TaAl thin film is deposited by a cyclical deposition process comprising at least one cycle comprising alternately and sequentially contacting the substrate with an Al precursor, such as TTBA and a Ti or Ta precursor, such as $TiCl_4$ or $TaCl_5$. In some embodiments at least one of the Ti or Ta precursor and/or Al precursor contacts the substrate in the presence of a nitrogen precursor, such as $N_2$, although not necessarily in this order. In some embodiments the TiAl or TaAl thin film may comprise nitrogen. In some embodiments the Ti or precursor may comprise a halide compound (e.g., $TiCl_4$ or $TaCl_5$) and the Al precursor may comprise an organometallic compound, such as, e.g., tritertbutylaluminum (TTBA).

In some embodiments, the thin layer of TiN and/or the TiAl or TaAl layer are treated with a silane/borane agent after each or both layers have been deposited. The silane/borane agent can reduce the TiN and/or TiAl or TaAl layer. In some embodiments, where layer 310 may comprise TiON, a silane/borane agent may reduce the layer 310 to essentially TiN. Thus, in some embodiments where the layer 310 has been oxidized subsequent to deposition the work function of the reduced layer or layers may be improved or restored to a value achieved prior to any oxidation of said layer or layers. In some embodiments the silane/borane agent may be selected from the group including silanes (e.g., SiH4, Si2H6, or Si3H8) and boranes (e.g., B2H6).

The thicknesses of the various layers in the stack may vary, though in some embodiments, such as the one illustrated in FIG. 3, layer 310 may have a thickness of about 10 Å to about 20 Å, preferably about 15 Å. In some embodiments layer 320 may have a thickness generally greater than the thickness of layer 310. In some embodiments the use of a protective treatment, for example as described above with respect to the TiN and TiAl or TaAl layers, and in U.S. Pat. No. 8,841,182, incorporated herein by reference, can have particular utility where the thicknesses of the various layers in a stack, such as the one illustrated in FIG. 3, are reduced to achieve smaller electronic devices and circuitry. This is because thinner layers are more prone to oxygen diffusing through them. And, in some embodiments, the use of a silane/borane agent does not appreciably increase the overall thickness of the stack.

When forming the TiAl or TaAl film, unreacted precursors and reaction byproducts may be removed from the substrate surface after the substrate the substrate has been contacted with said precursor or precursors. For example, and as described herein above, unreacted precursor and reaction byproducts, if any, may be removed from the substrate surface by evacuation and/or purging with an inert gas (e.g., $N_2$). In some embodiments, evacuation is achieved using a vacuum pump or a plurality of vacuum pumps. In some embodiments wherein a TiAl or TaAl layer is deposited by a cyclical deposition process as described herein above, a deposition cycle may be repeated until a TiAl or TaAl layer of the desired thickness has been formed.

In some embodiments, a silane/borane agent is also or only applied after all the deposition cycles of a desired deposition process have been completed. In some embodiments the silane/borane agent may be applied either as a pulse or a soak. In some embodiments, it may be preferable to apply the silane/borane agent as a soak after all the deposition cycles for the deposition of a given layer have been completed. Thus, in some embodiments a layer 310 may be deposited by a deposition process and a silane/borane agent may be applied to the layer 310 prior to the deposition of a subsequent layer 320. In some embodiments a layer 310 may be deposited by a deposition process and a layer 320 may then be deposited by a deposition process as described herein above, for example an ALD type deposition process. Subsequently the layer 320 may be exposed to a silane/borane agent. In some embodiments, the TiAl or TaAl layer has a thickness between about 5 Å and about 1000 Å after exposure to a silane/borane agent.

In some embodiments the TiAl or TaAl layer forms an electrode. In other embodiments another conductive material, such as a metal or poly-Si, is deposited over the TiAl or TaAl layer to thereby form an electrode. The additional conductive material may be deposited by ALD or by another deposition process, such as by CVD or PVD. The deposition of a subsequent layer may be selective, or may be followed by patterning steps. According to still other embodiments, annealing can be performed after the deposition of a TiAl or TaAl layer. Suitable atmospheres for such annealing processes, such as $N_2$ or forming gas ($N_2/H_2$) are apparent to a skilled artisan.

In some embodiments further processing steps, such as spacer deposition and source/drain implantation, may be performed subsequent to the deposition of the TiAl or TaAl layer as will be apparent to the skilled artisan.

The processes disclosed herein may be applied in a variety of contexts where protecting a layer from oxidation or reducing the effect of oxygen on the properties of an oxidized layer may be beneficial. Although primarily illustrated in the context of the fabrication of NMOS transistors, which may include planar "replacement gate" devices as well as multiple gate transistors, such as FinFETs, the skilled artisan will be aware of other relevant contexts in which the disclosed methods could be utilized, such as metal electrodes for memory structures where an n-type metal is needed.

Figure 4:
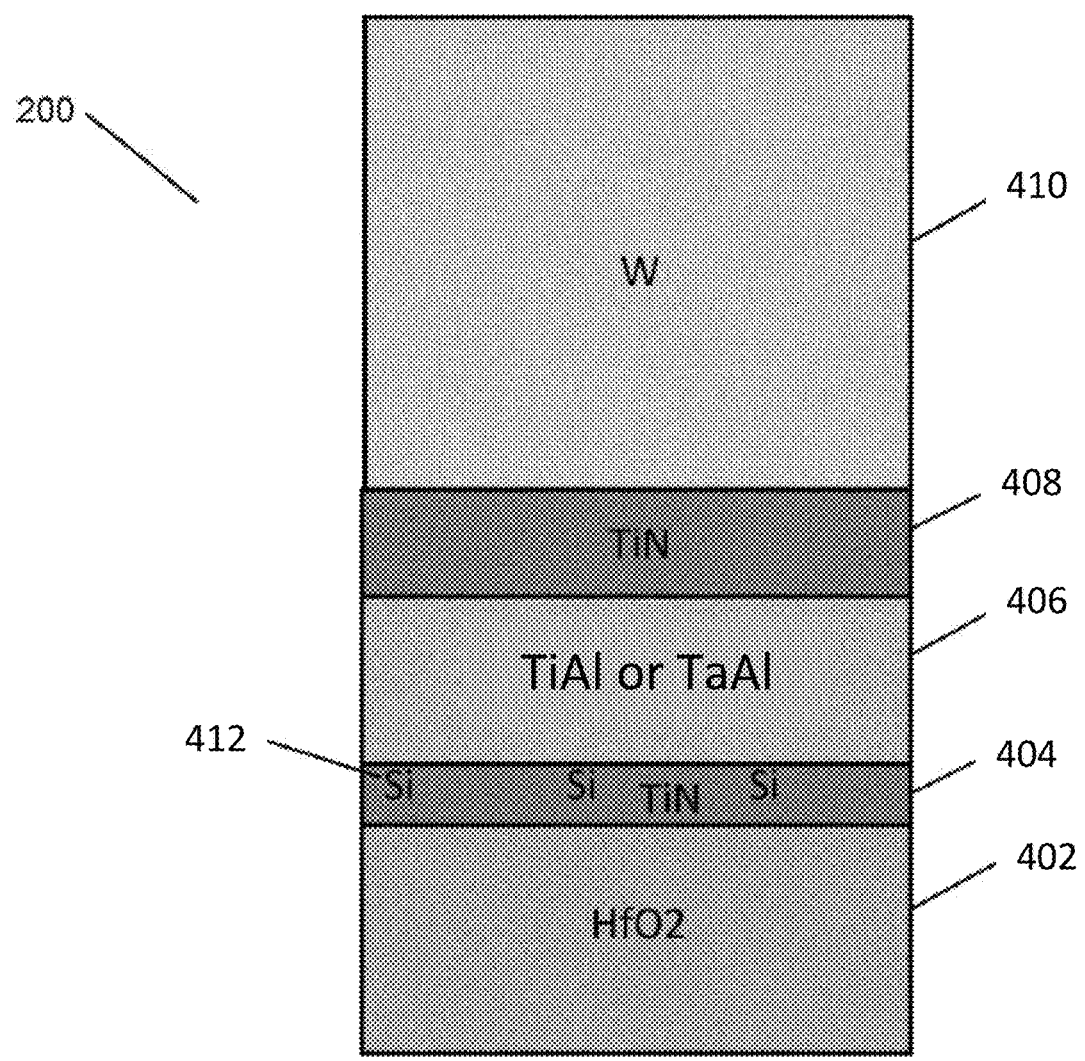
FIG. 4 is a schematic cross-sectional side view of an electrode structure, comprising an NMOS stack that includes a dielectric layer, a first metal nitride layer, a titanium aluminum or tantalum aluminum layer, a second metal nitride layer, and a metal layer, according to some embodiments of the invention.

Referring to FIG. 4, an exemplary embodiment of an NMOS stack 400 is illustrated. The stack 400 includes a dielectric layer 402, such as hafnium oxide, a first etch stop layer or bottom barrier layer 404, such as a titanium nitride (TiN) layer, a first n-type metal layer, here the TiAl or TaAl layer 406, a second metal nitride layer 408, and a metal layer 410, such as a tungsten (W) layer. In some embodiments the TiAl or TaAl layer may comprise nitrogen. The presence of silicon 412 derived from a protective treatment, as described in U.S. Pat. No. 8,846,550, incorporated herein by reference, is illustrated as being contained within the first metal nitride layer 404. While the silicon 412 may form a part of or be contained in any one of or more than one of the illustrated layers, FIG. 4 illustrates that the silicon 412 is located more or less at the interface of the first metal nitride layer 404 and the TiAl or TaAl layer 406.

In some embodiments, such as the one illustrated here, it may be beneficial to provide a protective treatment as a part of the deposition of the etch stop layer 404 or prior to the deposition of the TiAl or TaAl layer 406, where the protective treatment may provide silicon 412 (or boron), at least at or near the interface between the etch stop and n-metal films (the first metal nitride layer 404 and the TiAl or TaAl layer 406 as illustrated). In some embodiments, a protective treatment is applied to the first etch stop layer 404 once the substrate has been placed in a chamber for depositing the TiAl or TaAl layer but before deposition of the TiAl or TaAl layer has begun. Of course, treatment may be utilized to provide Si or B at the interface between any two layers.

In some embodiments the protective treatment may comprise exposing a thin film comprising metal on a substrate to a treatment agent comprising silane or borane. The treatment agent may react with oxygen that may be present on or in the thin film or with oxygen upon subsequent exposure of the thin film to oxygen or oxidizing agents. In some cases, at least some oxygen is bound to metal atoms in the thin film, and with exposure to the treatment agent comprising silane or borane the metal oxygen bonds are reduced by preferential formation of silicon oxide or boron oxide. The silane or borane agent may also bind oxygen that is not bound to metal, such as oxygen that may be present in the form of contaminants such as water, hydroxyl groups, etc.

As mentioned above, the treatment agent comprises one or more silanes and/or boranes, such as monosilane, disilane, trisilane, borane, diborane, and triborane.

The treatment agent may be applied in vapor or liquid form. However, the treatment is typically carried out by providing a vapor phase pulse of the treatment agent The length of time that the treatment agent is applied may vary, for example depending on the thickness of the film being treated and the amount of oxidation or the anticipated exposure to oxidizing agents. In some embodiments the treatment agent is contacted with the film for a period of about 1 second to about 10 minutes, from about 2 second to about 5 minutes, from about 10 seconds to about 2 minutes or from about 20 seconds to about 60 seconds. However, shorter or longer exposures can be utilized. For example, in some embodiments the treatment agent may be applied as a relatively short pulse, such as less than about 1 second. In some embodiments a partially or completely deposited film is soaked in the treatment agent, such as for 1 second or more, 10 seconds or more, 20 seconds or more, 30 seconds or more, or 60 seconds or more. In some embodiments the soak may be for at least one minute, two minutes, five minutes, ten minutes or more. Specific treatment times can be determined by the skilled artisan depending on the particular circumstances such as the type of film, thickness of the film, amount of existing oxidation of the film and the type of exposure to oxidizing agents that is anticipated.

In some embodiments, a thin film of the present disclosure is deposited according to a known process, such an ALD or a CVD process. A protective treatment can then be applied to the thin film after the thin film has been fully deposited. However, in some embodiments, the protective treatment forms a part of the deposition process. For example, where an ALD type process is used, such as in the deposition of a TiAl or TaAl layer, the protective treatment may comprise one step of at least one deposition cycle. In some cases, the protective treatment is provided in a certain number of ALD cycles or all of the ALD cycles. For example, the protective treatment may be provided as a separate pulse in every ALD cycle, or provided every 2, 3, 4, 5, 10, 20 or more ALD cycles. For CVD deposition, the CVD deposition process may be interrupted one or more times during deposition to provide the treatment agent. In some embodiments, the protective treatment is applied as the last pulse or exposure in the deposition process.

The use of a protective treatment can bind up at least some of the oxygen that may be present initially, or upon subsequent exposure, such as during transport from one chamber to another. The use of a protective treatment may also reduce at least some of the previously oxidized portions of a thin film, such as the first metal nitride layer 404. For example, substrates may be received that already contain an etch stop layer (or bottom barrier layer), such as a TiN layer, and that layer can be treated as described herein by exposure to a treatment agent prior to subsequent processing.

The thicknesses of the various layers in the stack 400 may vary, though in some embodiments, such as the one illustrated in FIG. 4, the first metal nitride layer 404 may be from about 5 Å to about 20 Å thick, for example about 15 Å thick, and the second metal nitride layer may be about 30 Å to about 50 Å thick. The use of a protective treatment as presently disclosed can have particular utility where the thicknesses of the various layers in a stack, such as stack 400, are reduced to achieve smaller electronic devices and circuitry.

The protective treatments disclosed herein could be applied to any one or more of the layers 402, 404, 406, 408, or 410 before, during, or after the deposition of each thin film. In some embodiments, it is preferable to treat one or both of layers 404 and 406. In some embodiments, it may be preferable to treat one or more of layers 404, 406, and 408. The use of a protective treatment before or during the formation of the NMOS workfunction setting layer (the TiAl or TaAl layer 406 as illustrated) has been mentioned; however a treatment agent could also or alternatively be applied before or during the deposition of the first etch stop layer (the first metal nitride layer 404). In some embodiments, the use of a protective treatment on the first metal nitride layer 404 may eliminate or reduce the need for such a treatment of any subsequent layers or at least the NMOS workfunction setting layer 406. Similarly, the use of a protective treatment before, during, or after the formation of the TiAl or TaAl layer 406 may eliminate or reduce the need for a similar treatment to subsequent layers, particularly if a treatment applied to the TiAl or TaAl layer 406 preserves the work function of the overall stack 400 irrespective of moderate oxidation of the subsequent layers 408 or 410.

However, in some embodiments, it may be beneficial to treat the second metal nitride layer 408 and/or the metal layer 410. As with the lower layers, a protective treatment may reduce oxidized portions of those layers, scavenge oxygen contaminates, and/or prevent subsequent oxidation when exposed to contaminates or the atmosphere.

Irrespective of the layer being discussed, the same methods for applying the protective treatment can be used. In some embodiments the treatment agent is provided as a pulse as a part of a deposition cycle. In some embodiments a deposited film, or portion of a deposited film is soaked in the treatment agent. For example, a protective treatment could be incorporated into the process for forming the TiAl or TaAl layer 406. And the treatment agent could be provided in every deposition cycle or just in some cycles.

With reference again to FIG. 4, in some embodiments a first metal nitride layer 404 is deposited over the dielectric layer 402, which may comprise a dielectric material such as hafnium oxide. A protective treatment may be applied before, during, and/or after the deposition of the first metal nitride layer 404. In some embodiments, it is desirable to apply a protective treatment to a completed first etch stop layer, such as a TiN layer, prior to the deposition of the NMOS workfunction setting layer, such as TiAl or TaAl layer 406, even if a protective treatment was used in the deposition of the first etch stop layer. For example, if some time has passed from the time the first metal nitride layer 404 was deposited and the time when the TiAl or TaAl layer 406 is deposited. Such a delay may increase the chances that the first metal nitride layer will be exposed to water, air, etc. Again, while illustrated in the context of forming TiAl or TaAl films in the context of an electrode and an NMOS stack, other contexts will be apparent to the skilled artisan.

Figure 5A:
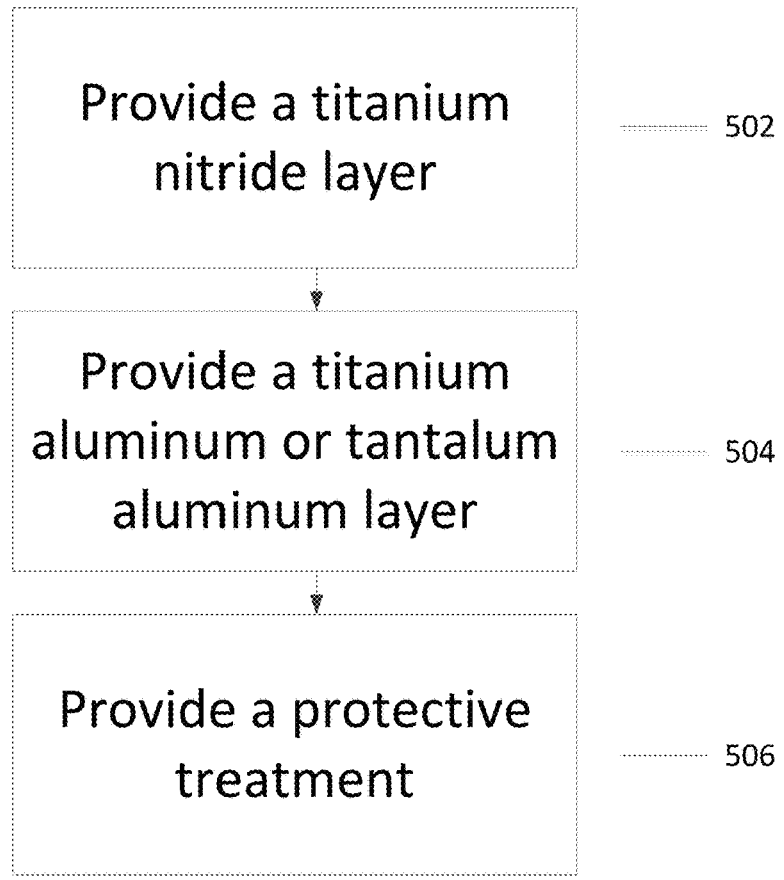
FIGS. 5A-C are process flow diagrams generally illustrating protective treatment of a TiN layer or a TiAl or TaAl layer during a process for forming a thin film stack in accordance with some embodiments.

Again referring to FIG. 4, the TiAl or TaAl layer 406 can be deposited over the first metal nitride layer 404. A protective treatment may be applied before, during, and/or after the deposition of the TiAl or TaAl layer 406. FIG. 5A illustrates one possible process where a titanium nitride layer is provided at step 502, and a TiAl or TaAl layer, is deposited over the titanium nitride layer at step 504. A protective treatment is then applied to the deposited TiAl or TaAl layer at step 506. In some embodiments, application of a protective treatment during or before the deposition of the work function setting TiAl or TaAl layer 406 may help minimize the presence of oxygen in the film while the TiAl or TaAl layer 406 awaits the second metal nitride layer 408 in a clustered or declustered process. The protective treatment applied at step 506 may comprise soaking the deposited TiAl or TaAl layer in a treatment agent comprising silane or borane. The protective treatment may reduce or bind to oxygen contaminates in the TiAl or TaAl layer n.

Figure 5B:
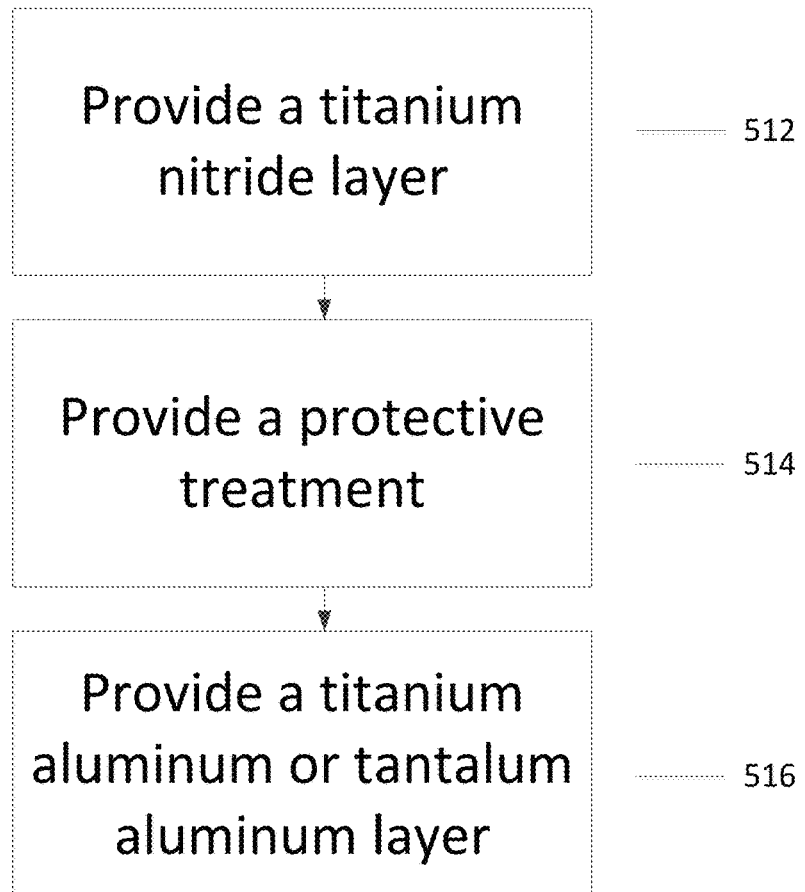

FIG. 5B illustrates one process where a titanium nitride layer is provided at step 512, and a protective treatment is applied to the titanium nitride layer at step 514. A TiAl or TaAl layer is then deposited according to a deposition process as described herein above at step 516. In this process, free oxygen that may have been present in or on the titanium nitride layer may be bound up by the protective treatment agent so as to prevent or reduce oxidation of the TiAl or TaAl deposited in step 516.

Other materials may also benefit from the application of a protective treatment according to the present disclosure. All NMOS workfunction layers, such as pure metals like Al and Ti, or transition metal nitrides, carbides, borides, silicides, etc. may suffer from oxygen incorporation making them more p-type. Accordingly, a protective treatment could be applied to films comprising any of such materials.

Figure 5C:
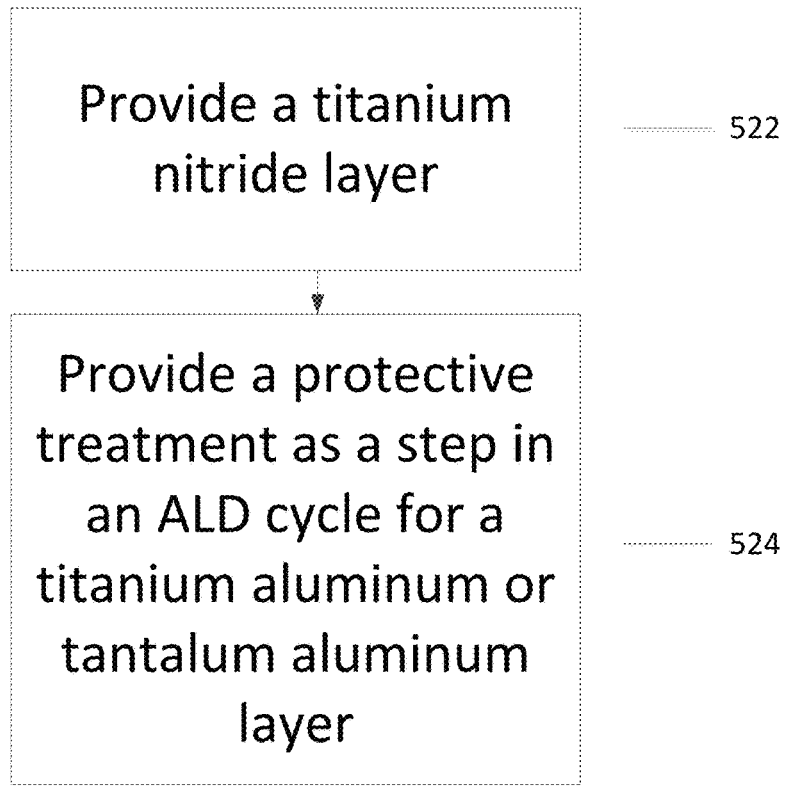

FIG. 5C illustrates one process where a titanium nitride is provided at step 522, and a TiAl or TaAl layer is deposited by a deposition process as described herein above at step 524 in which a protective treatment is incorporated into one or more of the deposition cycles. For example, the protective treatment may comprise a step in only one cycle or may comprise a step in a certain number of cycles, such as every other cycle or every third, fourth, fifth, sixth, seventh cycle, etc.

In some embodiments, the deposition of the TiAl or TaAl layer at step 524 may comprise a deposition process comprising at least one deposition cycle comprising:

contacting the substrate with a first vapor phase precursor comprising Ti or Ta, for example $TiCl_4$ or $TaCl_5$;

removing excess first precursor and reaction by products, if any, from the substrate;

contacting the substrate with a second vapor phase precursor comprising Al, for example TTBA;

removing from the substrate excess second precursor and any gaseous by-products;

wherein at least one of the contacting the substrate with a first vapor phase precursor comprising Ti or Ta and contacting the substrate with a second vapor phase precursor comprising Al steps occurs in the presence of a nitrogen precursor;

optionally contacting the substrate with a protective treatment agent comprising a silane or borane; and optionally repeating at least the first vapor phase precursor and second vapor phase precursor contacting and removing steps until TiAl or TaAl thin film n of the desired thickness has been formed.

In some embodiments, the deposition of the TiAl or TaAl layer comprising nitrogen at step 524 may comprise a deposition process comprising at least one deposition cycle comprising:

exposing the substrate to a first vapor phase precursor comprising Ti or Ta, for example $TiCl_4$ or $TaCl_5$;

exposing the substrate to purge gas and/or removing excess first precursor and reaction by products, if any, from the substrate;

exposing the substrate to a second vapor phase precursor comprising Al, for example TTBA;

exposing the substrate to purge gas and/or removing from the substrate excess second precursor and any gaseous by-products;

wherein at least one of the exposing the substrate to a first vapor phase precursor comprising Ti or Ta and exposing the substrate to a second vapor phase precursor comprising Al steps occurs in the presence of a nitrogen precursor;

optionally exposing the substrate to a protective treatment agent comprising a silane or borane; and optionally repeating at least the first vapor phase precursor and second vapor phase precursor exposing and removing steps until TiAl or TaAl thin film comprising nitrogen of the desired thickness has been formed.

In some embodiments the contacting the substrate with a protective treatment agent step can be included in each deposition cycle or only in some of the deposition cycles. Thus in some embodiments the first vapor phase precursor and second vapor phase precursor contacting and removing steps can be repeated several times before the contacting the substrate with a protective treatment agent step is introduced. The contacting the substrate with a protective treatment agent step may also be used prior to any deposition cycle or only as the first step in the first deposition cycle. Application of a protective treatment prior to any deposition cycle for depositing the TiAl or TaAl layer 406 may be desirable where the first metal nitride layer 404 has already been oxidized, such as where the first metal nitride layer has served as an etch-stop layer in a prior process. In such cases, it may be desirable to apply the protective treatment as a soak of a treatment agent comprising silane or borane prior to depositing the TiAl or TaAl layer 406. In some embodiments where the TiN layer 404 is treated, protective treatment during or after the deposition of the TiAl or TaAl layer 406 is not utilized. However, in some embodiments where the first metal nitride layer 404 has been treated, it may still be desirable to apply a protective treatment during or after the deposition of the TiAl or TaAl layer 406.

In some embodiments, NMOS stacks containing TiAl or TaAl layers fabricated using the methods disclosed herein exhibit a leakage ($J_g$) (at −1V stress,) of less than about $10^{-2}$ Å/cm², less than about $10^{-3}$ Å/cm², or less than about $3*10^{-4}$ Å/cm².

In some embodiments of the present disclosure, TiAl or TaAl layers can be formed in NMOS stack application in which the equivalent oxide thickness, or EOT, of the thin films can be less than about 1.3 nm, less than about 1.2 nm, preferably less than about 1.1 nm, less than about 1.05 nm or less than about 1.0 nm. In some embodiments the thickness of TiAl or TaAl films in NMOS stack application is from about 10 Å to about 100 Å, from about 15 Å to about 75 Å, from about 20 Å to about 50 Å. In some embodiments the thickness of TiAl or TaAl films is less than about 50 Å or less than about 30 Å. In other embodiments the thickness of TiAl or TaAl films is from about 5 Å to about 1000 Å, from about 15 Å to about 500 Å, or from about 20 Å to about 200 Å. In some embodiments the thickness of TiAl or TaAl films is less than about 500 Å or less than about 100 Å thick.

In some embodiments of the present disclosure, TiAl or TaAl layers comprising nitrogen can be formed in which the effective workfunction, or eWF, can be from about 4.0 to about 4.9 eV, from about 4.1 to about 4.6 eV, or from about 4.15 to about 4.3 eV. In some embodiments TiAl or TaAl layers comprising nitrogen can be formed in which the effective workfunction, or eWF, can be less than about 4.5 eV, less than about 4.4 eV, less than about 4.3 eV or less than about 4.25 eV. In some embodiments the work function of a TiAl or TaAl material is measured using TiAl or TaAl films from about 10 Å thick to about 100 Å thick, from about 15 Å thick to about 75 Å thick, or from about 20 Å thick to about 50 Å thick. In some embodiments the work function of a TiAl or TaAl material is measured using TiAl or TaAl films less than about 50 Å thick or less than about 30 Å thick.

In some embodiments, the use of a protective treatment such as a silane (e.g., disilane or trisilane) can reduce the resistivity of a TiAl or TaAl layer relative to a TiAl or TaAl layer to which a protective treatment is not exposed. In some embodiments, the resistivity is reduced up to or as much as about 30%, up to or as much as about 40%, or up to or as much as about 50%. In some embodiments, such as where a protective treatment is applied as soak after deposition, resistivity reduction may be as much as about 5%, as much as about 10%, or as much as about 20%.

Again referring to FIG. 4, a metal layer 410 may be deposited by any known method. A protective treatment may be applied before, during, and/or after deposition of the metal layer 410. In some embodiments, a second metal nitride layer 408 is provided, and the metal layer 410 is deposited over the metal nitride layer 408. The second metal nitride layer 408 can be deposited over the TiAl or TaAl layer 406. A protective treatment may be applied before, during, and/or after the deposition of the second metal nitride layer 408, similar to the first metal nitride layer 412. In this process, free oxygen that may have been present in or on the second metal nitride layer 408 may be bound up by the protective treatment so as to not oxidize the subsequently deposited material. Reducing the amount of free oxygen in the second metal nitride layer 408 may have the added benefit of diminishing the amount of oxygen that could diffuse down into the stack 400 during subsequent processes, such as downstream thermal processing, diffusion that could actually reach the workfunction layer (i.e., the TiAl or TaAl layer 406).

A protective treatment may be applied to the completed metal layer 410. The protective treatment may be applied as a soak to the deposited metal film. In some embodiments, a metal layer is deposited by an ALD method in which a protective treatment is incorporated into one or more of the deposition cycles. For example, the protective treatment may comprise a step in only one deposition cycle or may comprise a step in a certain number of cycles, such as every fifth, tenth, twentieth cycle, etc.

Again, while illustrated in the context of treating thin films in an NMOS stack, other metal-containing films can be treated as well. The exact composition of metal thin films produced and/or treated using the methods and materials disclosed herein may vary. For example, TiAl or TaAl films fabricated according to the present disclosure may contain a number of differing elemental components including, but not limited to titanium, aluminum, carbon, silicon and/or boron depending in part on the type of protective treatment used.

In some embodiments, the atomic percentage of silane or borane present in a film after treatment could be greater than about 10%, greater than about 25%, or greater than about 35%. In embodiments where the protective treatment is applied as soak, the silane or borane may be very concentrated at those surfaces that were treated, with the concentration dropping off rapidly below those surfaces. In embodiments where the protective treatment is applied as a part of a deposition process, such as in an ALD type process, the silane or borane concentration may be from about 5% to about 50%.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A process for depositing a titanium aluminum thin film comprising nitrogen and having a work function of less than 4.5 eV on a substrate in a reaction space, the process comprising at least one deposition cycle comprising alternately and sequentially contacting the substrate with a vapor phase Ti precursor and a vapor phase Al precursor at a temperature of 300° C. to 400° C., wherein the vapor phase Ti precursor comprises $TiCl_4$ and the vapor phase Al precursor comprises tritertbutylaluminum (TTBA), and wherein at least one of the vapor phase Ti precursor and the vapor phase Al precursor contacts the substrate in the presence of a vapor phase nitrogen precursor.

2. The process of claim 1, wherein vapor phase nitrogen precursor is introduced into the reaction space concurrently with one or both of the Ti precursor and the Al precursor.

3. The process of claim 2, wherein the vapor phase nitrogen precursor serves as a carrier gas for one or both of the Ti precursor and the Al precursor.

4. The process of claim 1, wherein the vapor phase nitrogen precursor comprises $N_2$.

5. The process of claim 1, wherein excess precursor and reaction byproducts, if any, are removed from the reaction space after contacting the substrate with the vapor phase Ti precursor and before subsequently contacting the substrate with the vapor phase Al precursor.

6. The process of claim 5, wherein the vapor phase nitrogen precursor flows into the reaction space throughout the deposition cycle and aids in the removal of excess precursor and reaction byproducts, if any, from the reaction space.

7. The process of claim 1, wherein the titanium aluminum thin film comprises up to about 40% carbon on an atomic basis.

8. The process of claim 1, wherein the titanium aluminum thin film comprises up to about 25% nitrogen on an atomic basis.

9. The process of claim 1, wherein the process is an atomic layer deposition process.

10. The process of claim 1, wherein at least one of the reactants at least partially decomposes on the substrate surface.

11. A process for depositing a titanium aluminum thin film comprising nitrogen and having a work function of less than 4.5 eV on a substrate in a reaction space, the process comprising one or more deposition cycles comprising:
contacting the substrate with a first vapor phase precursor comprising $TiCl_4$;
removing excess first vapor phase precursor and reaction byproducts, if any, from the substrate;
contacting the substrate with a second vapor phase precursor comprising TTBA; and
removing excess second vapor phase precursor and reaction byproducts, if any, from the substrate;
wherein at least one of the contacting the substrate with a first vapor phase precursor comprising $TiCl_4$ and contacting the substrate with a second vapor phase precursor comprising TTBA steps occurs in the presence of a nitrogen precursor comprising $N_2$, and
wherein the one or more deposition cycles are carried out at a temperature of 300° C. to 400° C.

12. The method of claim 11, wherein the titanium aluminum thin film comprising nitrogen comprises up to about 25% nitrogen on an atomic basis.

13. The method of claim 11, wherein the titanium aluminum thin film comprising nitrogen comprises up to about 40% carbon on an atomic basis.

14. The method of claim 11, wherein the nitrogen precursor comprising $N_2$ is introduced into the reaction space as a carrier gas for each of the first vapor phase precursor comprising $TiCl_4$ and the second vapor phase precursor comprising TTBA.

15. The method of claim 14, wherein removing excess second vapor phase precursor comprising TTBA comprises continuing to flow the nitrogen precursor comprising $N_2$ into the reaction space without providing second vapor phase precursor comprising TTBA.

16. The method of claim 14, wherein removing excess first vapor phase precursor comprising $TiCl_4$ comprises continuing to flow the nitrogen precursor comprising $N_2$ without providing first vapor phase precursor comprising $TiCl_4$.

17. The method of claim 11, wherein a deposition cycle is repeated two or more times to deposit a TiAl film comprising nitrogen to a desired thickness.

18. The method of claim 17, wherein both first vapor phase precursor comprising $TiCl_4$ and the second vapor phase precursor comprising TTBA contact the substrate in the presence of a nitrogen precursor comprising $N_2$ in each deposition cycle.

19. A process for depositing a titanium aluminum thin film comprising nitrogen and having a work function of less than 4.5 eV on a substrate in a reaction space, the process comprising at least one deposition cycle comprising:
contacting the substrate with a first vapor phase precursor comprising $TiCl_4$;
removing excess first vapor phase precursor and reaction byproducts, if any, from the substrate;

contacting the substrate with a second vapor phase precursor comprising TTBA; and removing excess second vapor phase precursor and reaction byproducts, if any, from the substrate;

wherein the substrate is contacted with the first and second vapor phase precursors at a temperature of 300° C. to 400° C. and at least one of the contacting the substrate with a first vapor phase precursor comprising $TiCl_4$ and contacting the substrate with a second vapor phase precursor comprising TTBA steps occurs in the presence of a nitrogen precursor comprising $N_2$;

contacting the substrate with a protective treatment reagent comprising a silane or borane; and repeating at least the first vapor phase precursor and second vapor phase precursor contacting and removing steps until TiAl thin film comprising nitrogen of the desired thickness has been formed.

20. The process of claim 19, wherein the substrate is contacted with a protective treatment reagent comprising a silane or borane in each deposition cycle.

21. The process of claim 19, wherein the silane or borane is selected from the group consisting of monosilane, disilane, trisilane, borane, diborane, and triborane.

22. The process of claim 19, wherein the substrate is only contacted with a protective treatment reagent comprising a silane or borane after every 2, 5, 10, 20 or more deposition cycles.

* * * * *